(12) United States Patent
Kang

(10) Patent No.: US 10,109,344 B2
(45) Date of Patent: Oct. 23, 2018

(54) SEMICONDUCTOR MEMORY DEVICES WITH BANKS WITH DIFFERENT NUMBERS OF MEMORY CELLS COUPLED TO THEIR BIT-LINES AND MEMORY SYSTEMS INCLUDING THE SAME

(71) Applicant: SAMSUNG ELECTRONICS CO., LTD., Suwon-si, Gyeonggi-do (KR)

(72) Inventor: Sang-Kyu Kang, Anyang-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/389,539

(22) Filed: Dec. 23, 2016

(65) Prior Publication Data

US 2017/0194045 A1 Jul. 6, 2017

(30) Foreign Application Priority Data

Dec. 30, 2015 (KR) .................. 10-2015-0189154

(51) Int. Cl.

| G11C 11/4096 | (2006.01) |
|---|---|
| G11C 5/02 | (2006.01) |
| G11C 7/10 | (2006.01) |
| G11C 11/408 | (2006.01) |
| G11C 11/4094 | (2006.01) |
| G11C 8/12 | (2006.01) |
| G11C 11/4074 | (2006.01) |
| G11C 11/4091 | (2006.01) |

(52) U.S. Cl.
CPC .......... *G11C 11/4096* (2013.01); *G11C 5/025* (2013.01); *G11C 7/1072* (2013.01); *G11C 8/12* (2013.01); *G11C 11/4074* (2013.01); *G11C 11/4085* (2013.01); *G11C 11/4087* (2013.01); *G11C 11/4094* (2013.01); *G11C 11/4091* (2013.01)

(58) Field of Classification Search
CPC ... G11C 11/4096; G11C 8/12; G11C 11/4074; G11C 5/025; G11C 7/1072; G11C 11/4094; G11C 11/4087; G11C 11/4085; G11C 11/4091

See application file for complete search history.

(56) References Cited

U.S. PATENT DOCUMENTS

| 5,138,705 | A | 8/1992 | Lo et al. |
|---|---|---|---|
| 5,452,257 | A | 9/1995 | Han |
| 5,691,945 | A | 11/1997 | Liou et al. |
| 6,041,016 | A | 3/2000 | Freker |
| 6,208,581 | B1 | 3/2001 | You |
| 6,212,121 | B1 | 4/2001 | Ryu et al. |
| 6,442,098 | B1 * | 8/2002 | Kengeri ............... G11C 7/1072 365/205 |

(Continued)

*Primary Examiner* — Vanthu Nguyen
*Assistant Examiner* — Jerome Leboeuf
(74) *Attorney, Agent, or Firm* — F. Chau & Associates, LLC

(57) ABSTRACT

A semiconductor memory device includes a memory cell array including a plurality of bank arrays and a control logic circuit. The control logic circuit controls access to the memory cell array in response to a command and an address. A first number of memory cells are coupled to a bit-line of a first bank array of the plurality of bank arrays, a second number of memory cells are coupled to a bit-line of a second bank array of the plurality of bank arrays and the first number is different from the second number.

15 Claims, 18 Drawing Sheets

(56) References Cited

U.S. PATENT DOCUMENTS

| | | |
|---|---|---|
| 6,535,450 B1 | 3/2003 | Ryan et al. |
| 6,665,785 B1 | 12/2003 | Hamilton, II et al. |
| 6,694,422 B1 | 2/2004 | Kim |
| 6,889,307 B1 | 5/2005 | Scheuerlein |
| 8,375,173 B2 | 2/2013 | Wang et al. |
| 2003/0185085 A1* | 10/2003 | Kaneko .................... G11C 7/12 365/230.03 |
| 2006/0120200 A1* | 6/2006 | Pochmuller ............. G06F 12/06 365/230.03 |
| 2013/0185527 A1* | 7/2013 | Puckett .................... G11C 8/12 711/154 |
| 2015/0049569 A1* | 2/2015 | Chou ........................ G11C 8/10 365/230.03 |

* cited by examiner

SEMICONDUCTOR MEMORY DEVICES WITH BANKS WITH DIFFERENT NUMBERS OF MEMORY CELLS COUPLED TO THEIR BIT-LINES AND MEMORY SYSTEMS INCLUDING THE SAME

CROSS-REFERENCE TO RELATED APPLICATION(S)

This application claims priority under 35 U.S.C. § 119 to Korean Patent Application No. 10-2015-0189154, filed on Dec. 30, 2015 in the Korean Intellectual Property Office, the disclosure of which is incorporated by reference herein in its entirety.

TECHNICAL FIELD

Exemplary embodiments of the present inventive concept relate to memory devices, and more particularly to semiconductor memory devices and memory systems including the same.

DISCUSSION OF THE RELATED ART

In general, a semiconductor memory device such as a double data rate synchronous dynamic random access memory (DDR SDRAM) includes tens of millions of memory cells. The DDR SDRAM stores and outputs data in response to a command requested from a chipset. For example, if the chipset requests the semiconductor memory device to perform a write operation, the semiconductor memory device stores data on a memory cell corresponding to an address inputted from the chipset. If the chipset requests the semiconductor memory device to perform a read operation, the semiconductor memory device outputs data stored in a memory cell corresponding to an address inputted from the chipset.

A group of memory cells in a semiconductor memory device may be referred to as a memory bank. The number of memory banks may be changed according to a design of the semiconductor memory device. Recently, the number of memory banks has been increased to provide more storage capacity. However, as the number of memory banks increases, so does current consumption.

SUMMARY

According to an exemplary embodiment of the present inventive concept, a semiconductor memory device includes a memory cell array including a plurality of bank arrays and a control logic circuit. The control logic circuit controls access to the memory cell array in response to a command and an address. A first number of memory cells are coupled to a bit-line of a first bank array of the plurality of bank arrays, a second number of memory cells are coupled to a bit-line of a second bank array of the plurality of bank arrays and the first number is different from the second number.

According to an exemplary embodiment of the present inventive concept, a semiconductor memory device includes a memory cell array including a plurality of bank arrays and a control logic circuit. The control logic circuit controls access to the memory cell array in response to a command and an address. Each of the plurality of bank arrays includes a first sub bank array and a second sub bank array which are distinguished from to each other by at least a portion of the address. A first number of memory cells are coupled to a bit-line of the first sub bank array, a second number of memory cells are coupled to a bit-line of the second sub bank array and the first number is different from the second number.

According to an exemplary embodiment of the present inventive concept, a memory system includes at least one semiconductor memory device and a memory controller. The memory controller controls the at least one semiconductor memory device. The at least one semiconductor memory device includes a memory cell array including a plurality of bank arrays and a control logic circuit. The control logic circuit controls access to the memory cell array in response to a command and an address from the memory controller. Each of the plurality of bank arrays includes a first sub bank array and a second sub bank array which are distinguished from each other by at least a portion of the address. A first number of memory cells are coupled to a bit-line of the first sub bank array, a second number of memory cells are coupled to a bit-line of the second sub bank array and the first number is different from the second number.

According to an exemplary embodiment of the present inventive concept, a semiconductor memory device includes: a memory array including a plurality of bank arrays; and a control logic circuit configured to perform a read operation and a write operation with respect to the memory array in response to a command and an address, wherein a bank array of the plurality of bank arrays includes a first sub bank array and a second sub bank array physically separate from each other in a substrate in which the plurality of bank arrays are formed, and wherein the second sub bank array provides a lower address space and the first sub bank array provides an upper address space for a memory controller.

BRIEF DESCRIPTION OF THE DRAWINGS

The above and other features of the present inventive concept will become more clearly understood by describing in detail exemplary embodiments thereof with reference to the accompanying drawings.

DETAILED DESCRIPTION OF THE EMBODIMENTS

Figure 1:
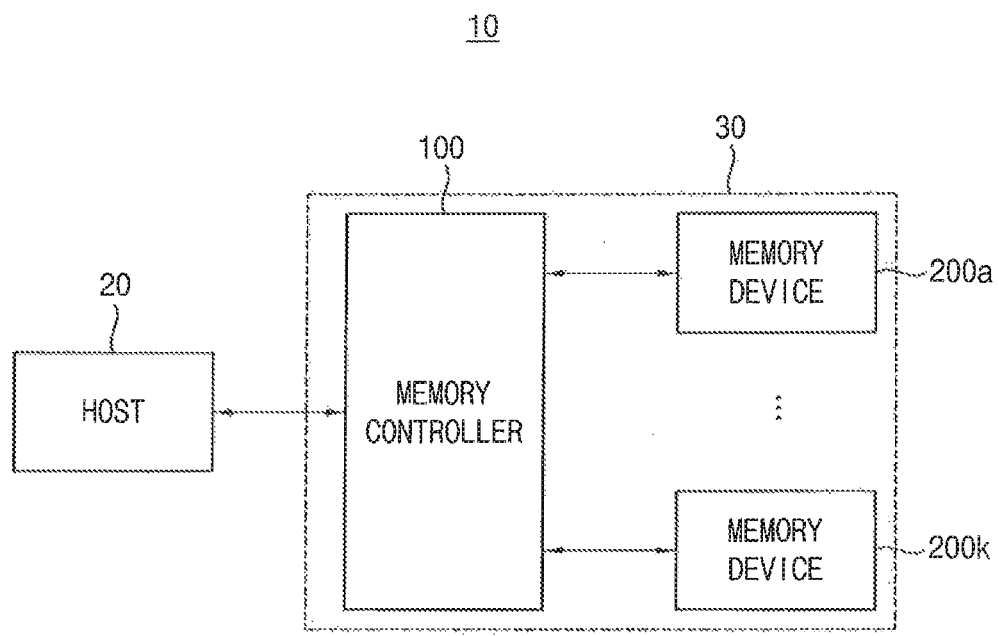
FIG. 1 is a block diagram illustrating an electronic system according to an exemplary embodiment of the present inventive concept.

FIG. 1 is a block diagram illustrating an electronic system according to an exemplary embodiment of the present inventive concept.

Referring to FIG. 1, an electronic system 10 may include a host 20 and a memory system 30. The memory system 30 may include a memory controller 100 and a plurality of semiconductor memory devices 200a~200k.

The host 20 may communicate with the memory system 30 through various interface protocols such as Peripheral Component Interconnect-Express (PCI-E), Advanced Technology Attachment (ATA), Serial ATA (SATA), Parallel ATA (PATA), or serial attached small computer system interface (SCSI) (or SAS). In addition, the host 20 may also communicate with the memory system 30 through interface protocols such as Universal Serial Bus (USB), Multi-Media Card (MMC), Enhanced Small Disk Interface (ESDI), or Integrated Drive Electronics (IDE).

The memory controller 100 may control an overall operation of the memory system 30. The memory controller 100 may control an overall data exchange between the host 20 and the plurality of semiconductor memory devices 200a~200k. For example, the memory controller 100 may write data in the plurality of semiconductor memory devices 200a~200k or read data from the plurality of semiconductor memory devices 200a~200k in response to a request from the host 20.

In addition, the memory controller 100 may issue operation commands to the plurality of semiconductor memory devices 200a~200k for controlling the plurality of semiconductor memory devices 200a~200k.

In an exemplary embodiment of the present inventive concept, each of the plurality of semiconductor memory devices 200a~200k may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc.

Figure 2:
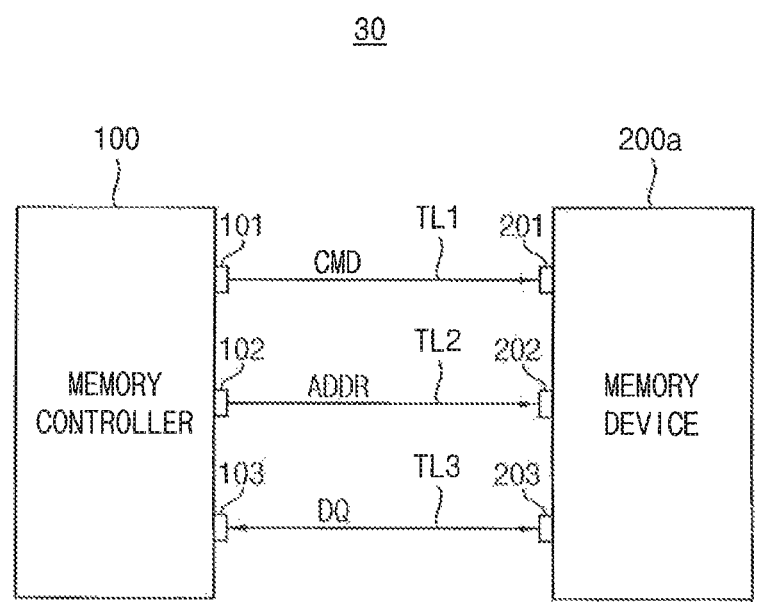
FIG. 2 is a block diagram illustrating a memory system in FIG. 1 according to an exemplary embodiment of the present inventive concept.

FIG. 2 is a block diagram illustrating the memory system in FIG. 1 according to an exemplary embodiment of the present inventive concept.

In FIG. 2, only one semiconductor memory device 200a in communication with the memory controller 100 is illustrated for convenience. However, the details discussed herein regarding the semiconductor memory device 200a may equally apply to the other semiconductor memory devices 200b~200k.

Referring to FIG. 2, the memory system 30 may include the memory controller 100 and the semiconductor memory device 200a. Each of the memory controller 100 and the semiconductor memory device 200a may be formed as a separate semiconductor chip or as a separate group of chips (e.g., the semiconductor memory device 200a may be a stack of semiconductor chips in a semiconductor package). The memory controller 100 and the semiconductor memory device 200a may be connected to each other through corresponding command pins 101 and 201, corresponding address pins 102 and 202 and corresponding data pins 103 and 203. The command pins 101 and 201 may transmit a command signal CMD through a command transmission line TL1, the address pins 102 and 202 may transmit an address signal ADDR through an address transmission line TL2, and the data pins 103 and 203 may exchange data DQ through a data transmission line TL3.

Referring to FIGS. 1 and 2, the memory controller 100 may input data to the semiconductor memory device 200a or may output data from the semiconductor memory device 200a through the data pins 103 and 203 based on a request from the host 20. In addition, the semiconductor memory device 200a may receive an address from the memory controller 100 through the address pins 102 and 202.

Figure 3:
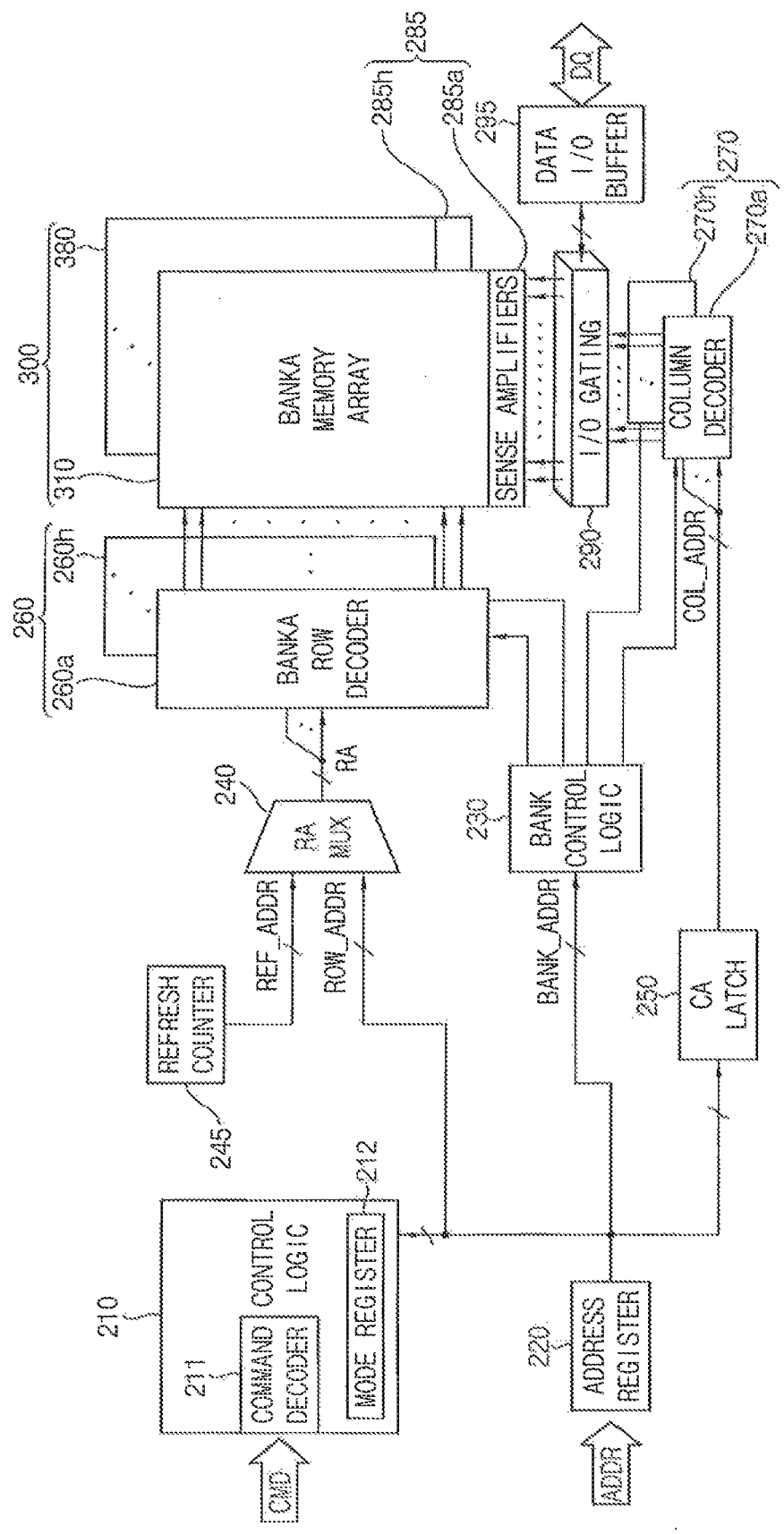
FIG. 3 is a block diagram illustrating a semiconductor memory device in FIG. 2 according to an exemplary embodiment of the present inventive concept.

FIG. 3 is a block diagram illustrating the semiconductor memory device in FIG. 2 according to an exemplary embodiment of the present inventive concept.

Referring to FIG. 3, the semiconductor memory device 200a may include a control logic circuit (also referred to as a control logic) 210, an address register 220, a bank control logic 230, a row address multiplexer 240, a column address latch 250, a row decoder 260, a column decoder 270, a memory cell array 300, a sense amplifier unit 285, an input/output (I/O) gating circuit 290, a data input/output (I/O) buffer 295, and a refresh counter 245.

The memory cell array 300 may include first through eighth bank arrays 310~380. The row decoder 260 may include first through eighth bank row decoders 260a~260h respectively coupled to the first through eighth bank arrays 310~380, the column decoder 270 may include first through eighth bank column decoders 270a~270h respectively coupled to the first through eighth bank arrays 310~380, and the sense amplifier unit 285 may include first through eighth bank sense amplifiers 285a~285h respectively coupled to the first through eighth bank arrays 310~380. The first through eighth bank arrays 310~380, the first through eighth bank row decoders 260a~260h, the first through eighth bank column decoders 270a~270h and first through eighth bank sense amplifiers 285a~285h may form first through eighth banks. Although the semiconductor memory device 200a is illustrated in FIG. 3 as including eight banks, the semiconductor memory device 200a may include any number of banks greater or less than eight.

The address register 220 may receive an address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth bank row decoders 260a~260h.

The activated one of the first through eighth bank row decoders 260a~260h may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In an exemplary embodiment of the present inventive concept, in a burst mode, the column address latch 250 may generate column addresses that increment from the received column address COL_ADDR. The column address latch 250 may apply the temporarily stored or generated column address to the first through eighth bank column decoders 270a~270h.

The activated one of the first through eighth bank column decoders 270a~270h may decode the column address COL_ADDR that is output from the column address latch 250, and may control the input/output gating circuit 290 to output data corresponding to the column address COL_ADDR.

The I/O gating circuit 290 may include circuitry for gating input/output data. The I/O gating circuit 290 may further include read data latches for storing data that is output from the first through eighth bank arrays 310~380, and write drivers for writing data to the first through eighth bank arrays 310~380.

Data DQ to be read from one bank array of the first through eighth bank arrays 310~380 may be sensed by a sense amplifier coupled to the one bank array from which the data is to be read, and may be stored in the read data latches. The data DQ stored in the read data latches may be provided to the memory controller 100 via the data I/O buffer 295. Data DQ to be written in one bank array of the first through eighth bank arrays 310~380 may be provided to the data I/O buffer 295 from the memory controller 100. For example, one of the write drivers may write the data DQ in the one bank array of the first through eighth bank arrays 310~380.

The control logic circuit 210 may control operations of the semiconductor memory device 200a. For example, the control logic circuit 210 may generate control signals for the semiconductor memory device 200a to perform a write operation or a read operation. The control logic circuit 210 may include a command decoder 211 that decodes a command CMD received from the memory controller 100 and a mode register 212 that sets an operation mode of the semiconductor memory device 200a. The control logic circuit 210 may generate a mode signal MS based on the decoded command CMD.

For example, the command decoder 211 may generate the control signals corresponding to the command CMD by decoding a write enable signal (/WE), a row address strobe signal (/RAS), a column address strobe signal (/CAS), a chip select signal (/CS), etc.

Figure 4:
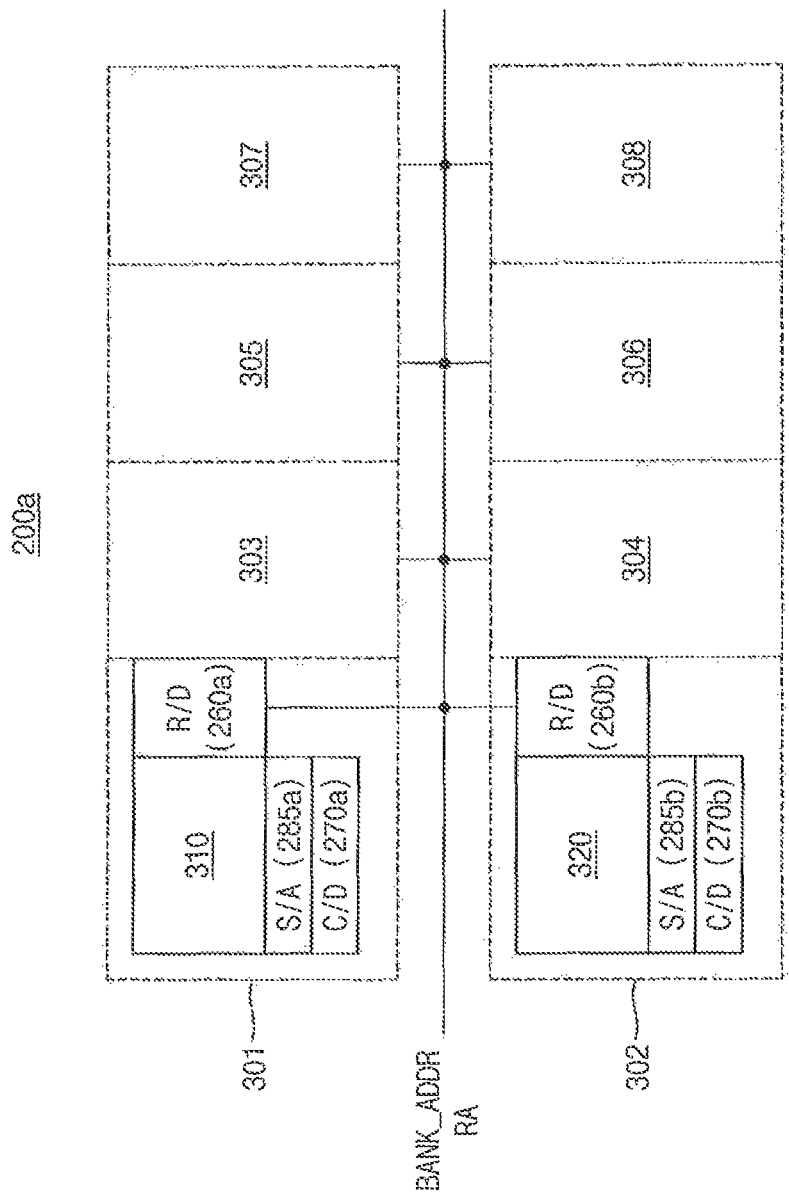
FIG. 4 is a block diagram illustrating the semiconductor memory device of FIG. 3 according to an exemplary embodiment of the present inventive concept.

FIG. 4 is a block diagram illustrating the semiconductor memory device of FIG. 3 according to an exemplary embodiment of the present inventive concept.

Referring to FIG. 4, the semiconductor memory device 200a may include a plurality of banks 301~308 in which a plurality of memory cells are arranged in columns and rows. Each of the plurality of banks 301~308 may include a plurality of word-lines, a plurality of bit-lines, and a plurality of memory cells disposed near intersections between the word-lines and the bit-lines.

The first bank 301 may include the first bank array 310, the bank row decoder 260a, the bank sense amplifier 285a and the bank column decoder 270a. The second bank 302 may include the second bank array 320, the bank row decoder 260b, the bank sense amplifier 285b and the bank column decoder 270b. Each configuration of the third through eighth banks 303~308 may be substantially the same as or similar to each configuration of the first bank 301 and the second bank 302. The bank row decoder 260a may receive the bank address BANK_ADDR and the row address RA. The bank column decoder 270a may receive the column address COL_ADDR. One of the plurality of banks 301~308 may be selected in response to the bank address BANK_ADDR and memory cells in the selected bank may be accessed in response to the row address RA and the column address COL_ADDR.

Figure 5:
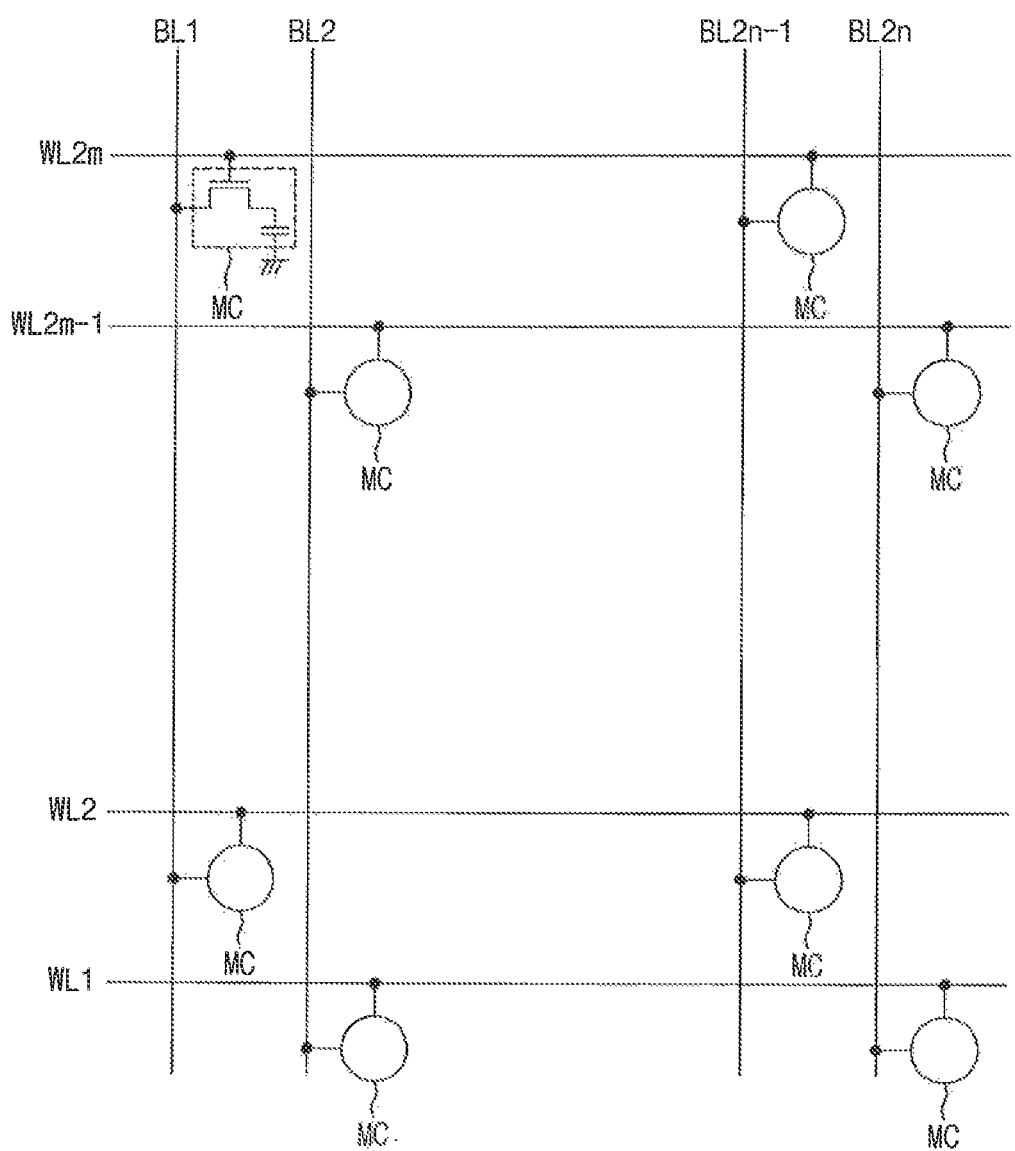
FIG. 5 illustrates a first bank array in the semiconductor memory device of FIGS. 3 and 4 according to an exemplary embodiment of the present inventive concept.

FIG. 5 illustrates the first bank array in the semiconductor memory device of FIGS. 3 and 4 according to an exemplary embodiment of the present inventive concept.

Referring to FIG. 5, the first bank array 310 includes a plurality of word-lines WL1~WL2$m$ ($m$ is a natural number greater than two), a plurality of bit-lines BL1~BL2$n$ ($n$ is a natural number greater than two), and a plurality of memory cells MCs disposed near intersections between the word-lines WL1~WL2m and the bit-lines BL1~BL2n. In an exemplary embodiment of the present inventive concept, each of the plurality of memory cells MCs may include a DRAM cell structure. The plurality of word-lines WL1~WL2m to which the plurality of memory cells MCs are connected may be referred to as rows of the first bank array 310 and the plurality of bit-lines BL1~BL2n to which the plurality of memory cells MCs are connected may be referred to as columns of the first bank array 310.

In FIG. 5, m memory cells are coupled to a bit-line BL of the first bank array 310 and m memory cells are coupled to a word-line of the first bank array 310. The memory cells MC may each include a transistor and a capacitor connected to a bit line and a word line as shown in FIG. 5, for example.

Figure 6:
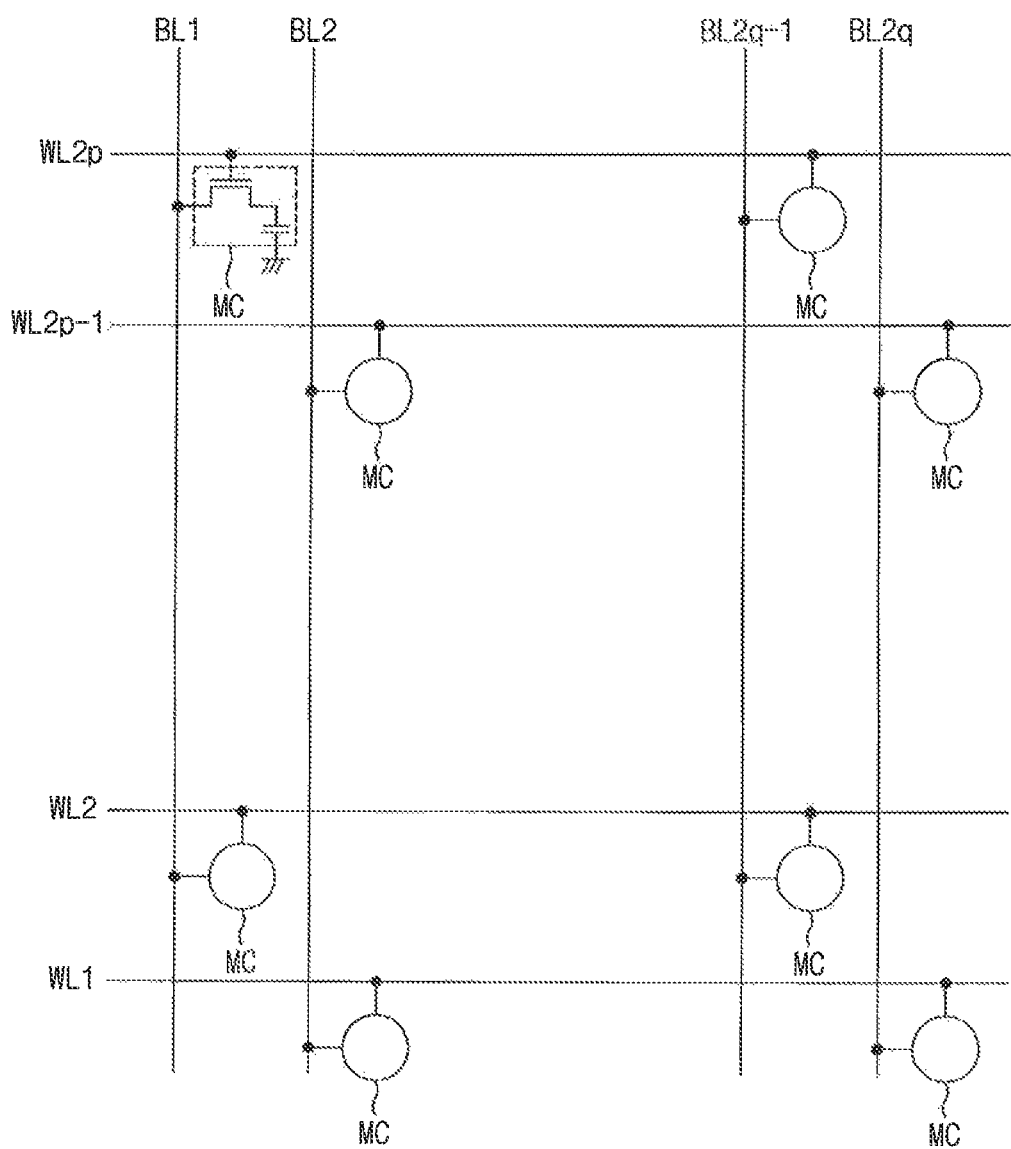
FIG. 6 illustrates a second bank array in the semiconductor memory device of FIGS. 3 and 4 according to an exemplary embodiment of the present inventive concept.

FIG. 6 illustrates the second bank array in the semiconductor memory device of FIGS. 3 and 4 according to an exemplary embodiment of the present inventive concept.

Referring to FIG. 6, the second bank array 320 includes a plurality of word-lines WL1~WL2p (p is a natural number greater than two), a plurality of bit-lines BL1~BL2q (q is a natural number greater than two), and a plurality of memory cells MCs disposed near intersections between the word-lines WL1~WL2p and the bit-lines BL1~BL2q. In an exemplary embodiment of the present inventive concept, each of the plurality of memory cells MCs may include a DRAM cell structure. The plurality of word-lines WL1~WL2p to which the plurality of memory cells MCs are connected may be referred to as rows of the second bank array 320 and the plurality of bit-lines BL1~BL2q to which the plurality of memory cells MCs are connected may be referred to as columns of the second bank array 320.

In FIG. 6, p memory cells are coupled to a bit-line BL of the second bank array 320 and q memory cells are coupled to a word-line of the second bank array 320. The memory cells MC may each include a transistor and a capacitor connected to a bit line and a word line as shown in FIG. 6, for example.

In FIGS. 5 and 6, m may be greater than p and n may be greater than q. In other words, a page size of the first bank array 310 may be greater than a page size of the second bank array 320, a first number (e.g., m) of memory cells may be coupled to one bit-line of the first bank array 310 and a second number (e.g., p) of memory cells may be coupled to one bit-line of the second bank array 320. In an exemplary embodiment of the present inventive concept, m may be two times greater than p and n may be two times greater than q. In the semiconductor memory device of FIGS. 3 and 4, each of a number of memory cells coupled to one bit-line and a number of memory cells coupled to one word-line of the first bank array 310 may be greater than each of a number of memory cells coupled to one bit-line and a number of memory cells coupled to one word-line of the second bank array 320.

Figure 7:
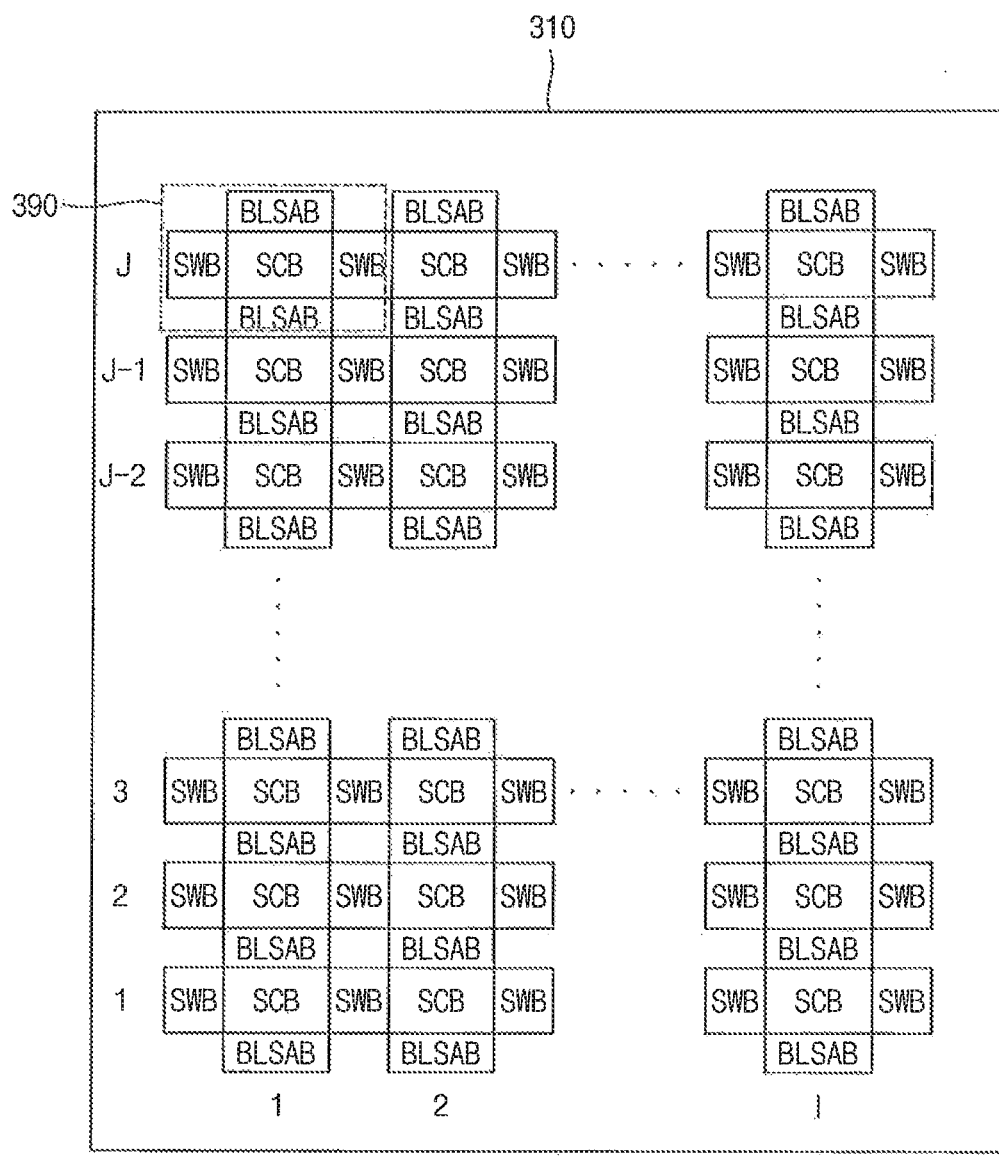
FIG. 7 is a diagram of an architecture of the first bank array in the semiconductor memory device of FIGS. 3 and 4 according to an exemplary embodiment of the present inventive concept.

FIG. 7 is a diagram of an architecture of the first bank array in the semiconductor memory device of FIGS. 3 and 4 according to an exemplary embodiment of the present inventive concept.

Referring to FIG. 7, in the first bank array 310, I sub array blocks SCB may be disposed in a first direction D1, and J sub array blocks SCB may be disposed in a second direction D2 orthogonal (or substantially perpendicular) to the first direction D1. A plurality of bit-lines, a plurality of word-lines, and a plurality of memory cells may be disposed in each of the sub array blocks SCB. The plurality of memory cells may be disposed at intersections between the bit-lines and the word-lines.

I+1 sub word-line driver regions SWB may be disposed between the sub array blocks SCB in the first direction D1. Sub word-line drivers may be disposed in the sub word-line driver regions SWB.

J+1 bit-line sense amplifier regions BLSAB may be disposed between the sub array blocks SCB in the second direction D2. Bit-line sense amplifiers to sense data stored in the memory cells may be disposed in the bit-line sense amplifier regions BLSAB.

Figure 8:
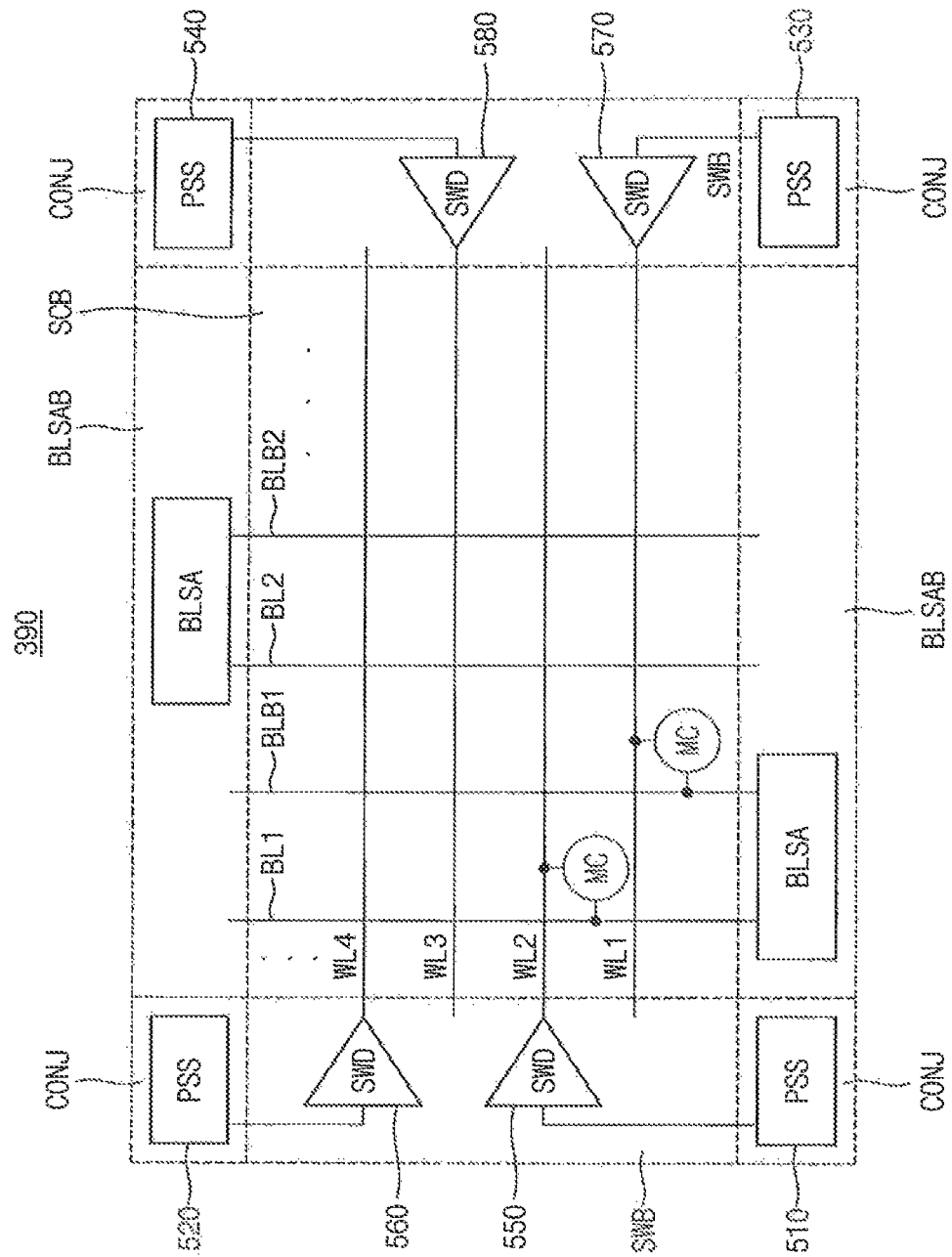
FIG. 8 is a portion of the first bank array of FIG. 7 according to an exemplary embodiment of the present inventive concept.

FIG. 8 is a portion of the first bank array of FIG. 7 according to an exemplary embodiment of the present inventive concept.

Referring to FIGS. 7 and 8, in a portion 390 of the first bank array 310, the sub array block SCB, the bit-line sense amplifier regions BLSAB, the sub word-line driver regions SWB and conjunction regions CONJ are disposed.

The sub array block SCB includes a plurality of word-lines WL1~WL4 extending in a row direction and a plurality of bit-line pairs BL1~BL2 and BLB1~BLB2 extending in a column direction. The sub array block SCB includes a plurality of memory cells MCs disposed at intersections between the word-lines WL1~WL4 and the bit-line pairs BL1~BL2 and BLB1~BLB2.

The sub word-line driver regions SWB include a plurality of sub word-line drivers 550, 560, 570 and 580 that drive the word-lines WL1~WL4 respectively. The sub word-line drivers 550 and 560 may be disposed in the sub word-line driver region SWB at the left side of the sub array block SCB and the sub word-line drivers 570 and 580 may be disposed in the sub word-line driver region SWB at the right side of the sub array block SCB.

The bit-line sense amplifier regions BLSAB include bit-line sense amplifiers BLSA coupled to the bit-line pairs BL1~BL2 and BLB1~BLB2. For example, one of the bit-line sense amplifiers BLSA may sense and amplify a voltage difference between one of the bit-line pairs BL1~BL2 and BLB1~BLB2 to provide the amplified voltage difference to a local input/output line pair. As illustrated in FIG. 8, the bit-line sense amplifiers BLSA may be alternately disposed at an upper portion and a lower portion of the sub array block SCB.

The conjunction regions CONJ are disposed adjacent to the bit-line sense amplifier regions BLSAB, the sub word-line driver regions SWB and the sub array block SCB. A plurality of power selection switches 510, 520, 530 and 540 may be disposed in the conjunction regions CONJ.

The power selection switch 510 is coupled to the sub word-line driver 550 that drives the word-line WL2, the power selection switch 520 is coupled to the sub word-line driver 560 that drives the word-line WL4, the power selection switch 530 is coupled to the sub word-line driver 570 that drives the word-line WL1 and the power selection switch 540 is coupled to the sub word-line driver 580 that drives the word-line WL3.

The second bank array 320 of the semiconductor memory device 200a may have an arrangement similar to an arrangement of the first bank array 310 of FIG. 7. A number of memory cells coupled to one bit-line of the sub array block SCB in the first bank array 310 may be greater than a number of memory cells coupled to one bit-line of the sub array block SCB in the second bank array 320. In addition, a number of memory cells coupled to one word-line of the sub array block SCB in the first bank array 310 may be greater than a number of memory cells coupled to one word-line of the sub array block SCB in the second bank array 320.

Figure 9A:
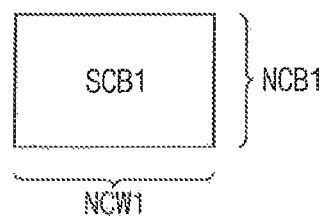
FIG. 9A illustrates a sub array block in the first bank array of FIG. 7 according to an exemplary embodiment of the present inventive concept.
Figure 9B:
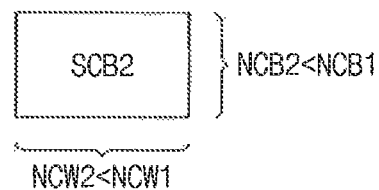
FIG. 9B illustrates a sub array block in the second bank array in the semiconductor memory device 200a of FIGS. 3 and 4 according to an exemplary embodiment of the present inventive concept.

FIG. 9A illustrates a sub array block in the first bank array of FIG. 7 and FIG. 9B illustrates a sub array block in the second bank array in the semiconductor memory device of FIGS. 3 and 4 according to an exemplary embodiment of the present inventive concept.

Referring to FIGS. 9A and 9B, a number NCB1 of memory cells coupled to one bit-line of a sub array block SCB1 in the first bank array 310 may be greater than a number NCB2 of memory cells coupled to one bit-line of a sub array block SCB2 in the second bank array 320. Still referring to FIGS. 9A and 9B, a number NCW1 of memory cells coupled to one word-line of the sub array block SCB1 in the first bank array 310 may be greater than a number NCW2 of memory cells coupled to one word-line of the sub array block SCB2 in the second bank array 320.

Figure 10:
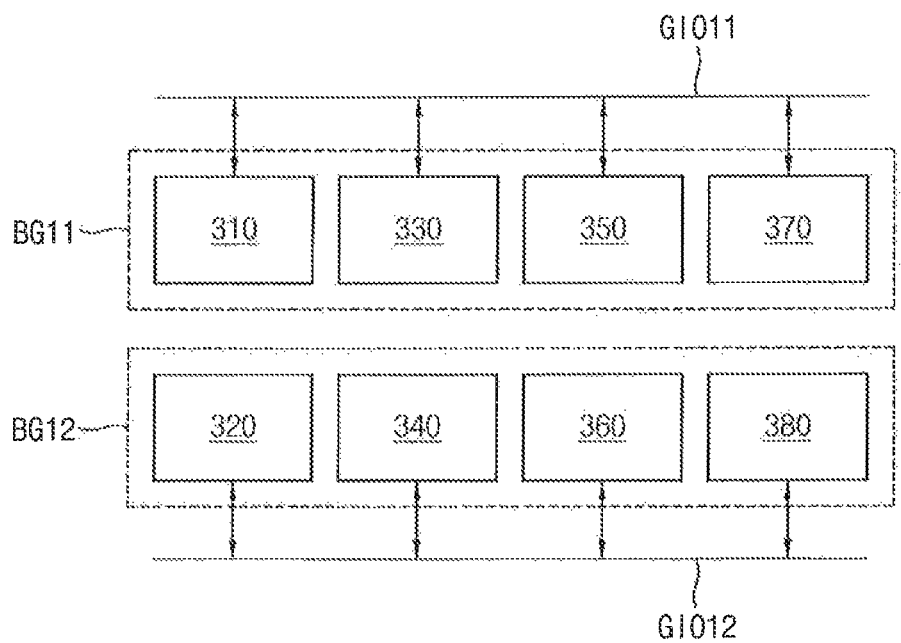
FIG. 10 illustrates the bank arrays in the semiconductor memory device of FIGS. 3 and 4 grouped according to an exemplary embodiment of the present inventive concept.

FIG. 10 illustrates the bank arrays in the semiconductor memory device of FIGS. 3 and 4 grouped according to an exemplary embodiment of the present inventive concept.

Referring to FIGS. 3,4 and 10, the first through eighth bank arrays 310~380 may be grouped into a first bank group BG11 and a second bank group BG12 based on the bank address BANK_ADDR.

The first bank group BG11 may include the first, third, fifth and seventh bank arrays 310, 330, 350 and 370. The second bank group BG12 may include the second, fourth, sixth and eighth bank arrays 320, 340, 360 and 380.

One or more banks (or arrays) may be referred to as a bank group, and one or more banks may share data input/output lines. As shown in FIG. 10, a plurality of bank arrays included in a single bank group may share a global input/output line for inputting and outputting data. A first global input/output line GIO11 is connected to the first bank group BG11 and a second global input/output line GIO12 is connected to the second bank group BG12.

Each configuration of the third, fifth and seventh bank arrays 330, 350 and 370 in the first bank group BG11 may be substantially the same as the configuration of the first bank array 310. In each of the third, fifth and seventh bank arrays 330, 350 and 370, m memory cells may be coupled to one bit-line and n memory cells may be coupled to one word-line as described with reference to FIG. 5.

Each configuration of the fourth, sixth and eighth bank arrays 340, 360 and 380 in the second bank group BG12 may be substantially the same as the configuration of the second bank array 320. In each of the fourth, sixth and eighth bank arrays 340, 360 and 380, p memory cells may be coupled to one bit-line and q memory cells may be coupled to one word-line as described with reference to FIG. 6.

When the number of memory cells coupled to a bit-line and a page size of each bank array in the first bank group BG11 are configured differently from the number of memory cells coupled to a bit-line and a page size of each bank array in the second bank group BG11, the grouping in FIG. 10 may provide a data storage coverage which is substantially the same as a case when the number of memory cells coupled to a bit-line and a page size of each bank array are same as each other. In addition, the grouping in FIG. 10 can reduce current consumption of IDD0, IDD3 and IDD5, for example.

In addition, bit-line loading and word-line loading of each of the first, third, fifth and seventh bank arrays 310, 330, 350 and 370 in the first bank group BG11 may be greater than bit-line loading and word-line loading of each of the second, fourth, sixth and eighth bank arrays 320, 340, 360 and 380 in the second bank group BG12. Therefore, a time required for accessing the bank arrays in the second bank group BG12 may be shorter than a time required for accessing the bank arrays in the first bank group BG11. Accordingly, when data with a high frequency of access is stored in the bank arrays in the second bank group BG12 and data with a low frequency of access is stored in the bank arrays in the first bank group BG11, an operating speed of the semiconductor memory device 200a may be increased and a current consumption in the semiconductor memory device 200a may be reduced.

Figure 11:
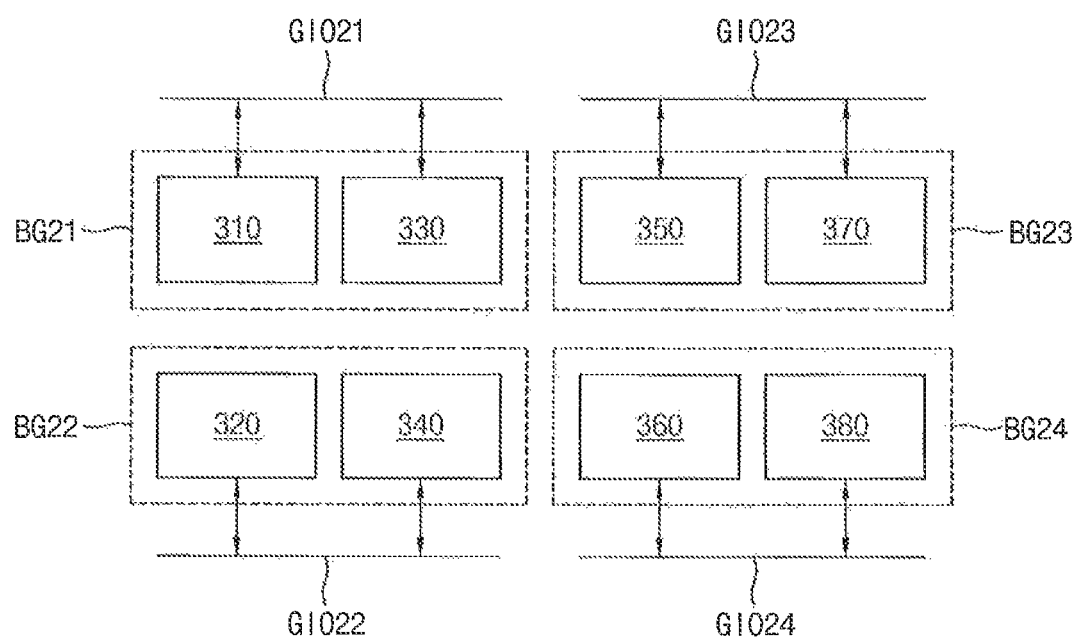
FIG. 11 illustrates the bank arrays in the semiconductor memory device of FIGS. 3 and 4 grouped according to an exemplary embodiment of the present inventive concept.

FIG. 11 illustrates the bank arrays in the semiconductor memory device of FIGS. 3 and 4 grouped according to an exemplary embodiment of the present inventive concept.

Referring to FIGS. 3, 4 and 11, the first through eighth bank arrays 310~380 may be grouped into first through fourth bank groups BG21~BG24 based on the bank address BANK_ADDR.

The first bank group BG21 may include the first and third bank arrays 310 and 330, the second bank group BG22 may include the second and fourth bank arrays 320 and 340, the third bank group BG23 may include the fifth and seventh bank arrays 350 and 370, and the fourth bank group BG24 may include the sixth and eighth bank arrays 360 and 380.

A first global input/output line GIO21 is connected to the first bank group BG21, a second global input/output line GIO22 is connected to the second bank group BG22, a third global input/output line GIO23 is connected to the third bank group BG23 and a fourth global input/output line GIO24 is connected to the fourth bank group BG24.

The configuration of the third bank array 330 in the first bank group BG21 may be substantially the same as the configuration of the first bank array 310 in the first bank group BG21. In other words, m memory cells may be coupled to one bit-line and n memory cells may be coupled to one word-line of the third bank array 330 as described with reference to FIG. 5.

Each configuration of the fourth bank array 340 in the second bank group BG22, the fifth and seventh bank arrays 350 and 370 in the third bank group BG23 and the sixth and eighth bank arrays 360 and 380 in the fourth bank group BG24 may be substantially the same as the configuration of the second bank array 320 in the second bank group BG22. In each of the fourth, fifth, sixth, seventh and eighth bank arrays 340~380, p memory cells may be coupled to one bit-line and q memory cells may be coupled to one word-line as described with reference to FIG. 6.

Figure 12:
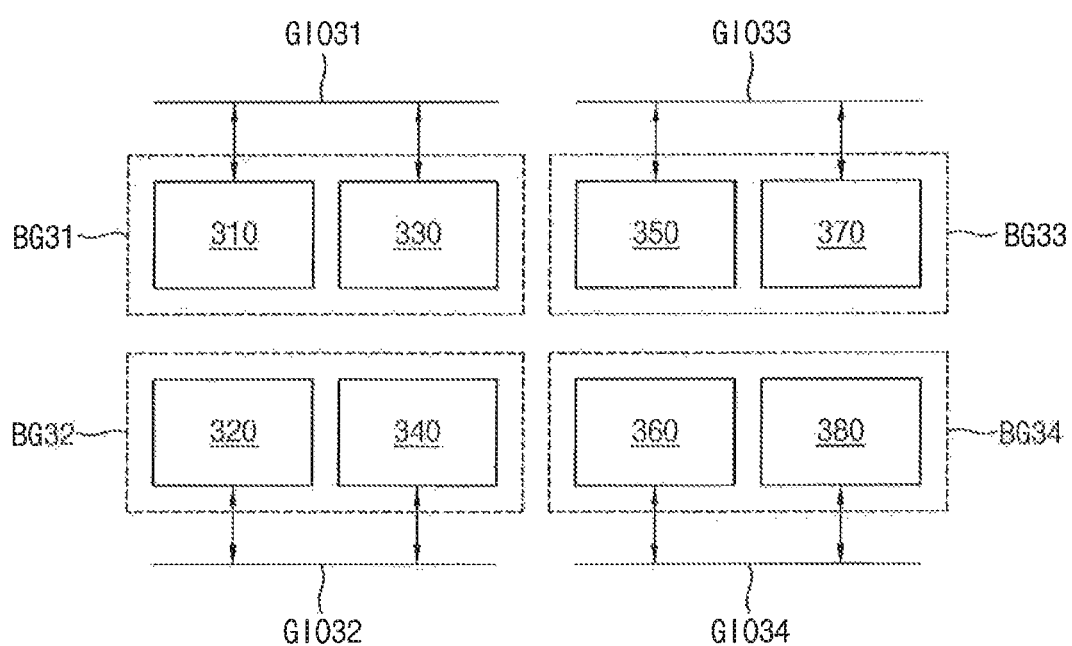
FIG. 12 illustrates the bank arrays in the semiconductor memory device of FIGS. 3 and 4 grouped according to an exemplary embodiment of the present inventive concept.

FIG. 12 illustrates the bank arrays in the semiconductor memory device of FIGS. 3 and 4 grouped according to an exemplary embodiment of the present inventive concept.

Referring to FIGS. 3,4 and 12, the first through eighth bank arrays 310~380 may be grouped into first through fourth bank groups BG31~BG34 based on the bank address BANK_ADDR.

The first bank group BG31 may include the first and third bank arrays 310 and 330, the second bank group BG32 may include the second and fourth bank arrays 320 and 340, the third bank group BG33 may include the fifth and seventh bank arrays 350 and 370, and the fourth bank group BG34 may include the sixth and eighth bank arrays 360 and 380.

A first global input/output line GIO31 is connected to the first bank group BG31, a second global input/output line GIO32 is connected to the second bank group BG32, a third global input/output line GIO33 is connected to the third bank group BG33 and a fourth global input/output line GIO34 is connected to the fourth bank group BG34.

In FIG. 12, the bank arrays in the same bank group of the first through fourth bank groups BG31~BG34 may have the same page size and the same number of memory cells coupled to one bit-line. In addition, each of the bank arrays in different bank groups may have a different number of memory cells coupled to one bit-line with respect to each other. In other words, a first bank array in a first bank group may have a different number of memory cells coupled to one bit-line than a second bank array in a second bank group.

Figure 13:
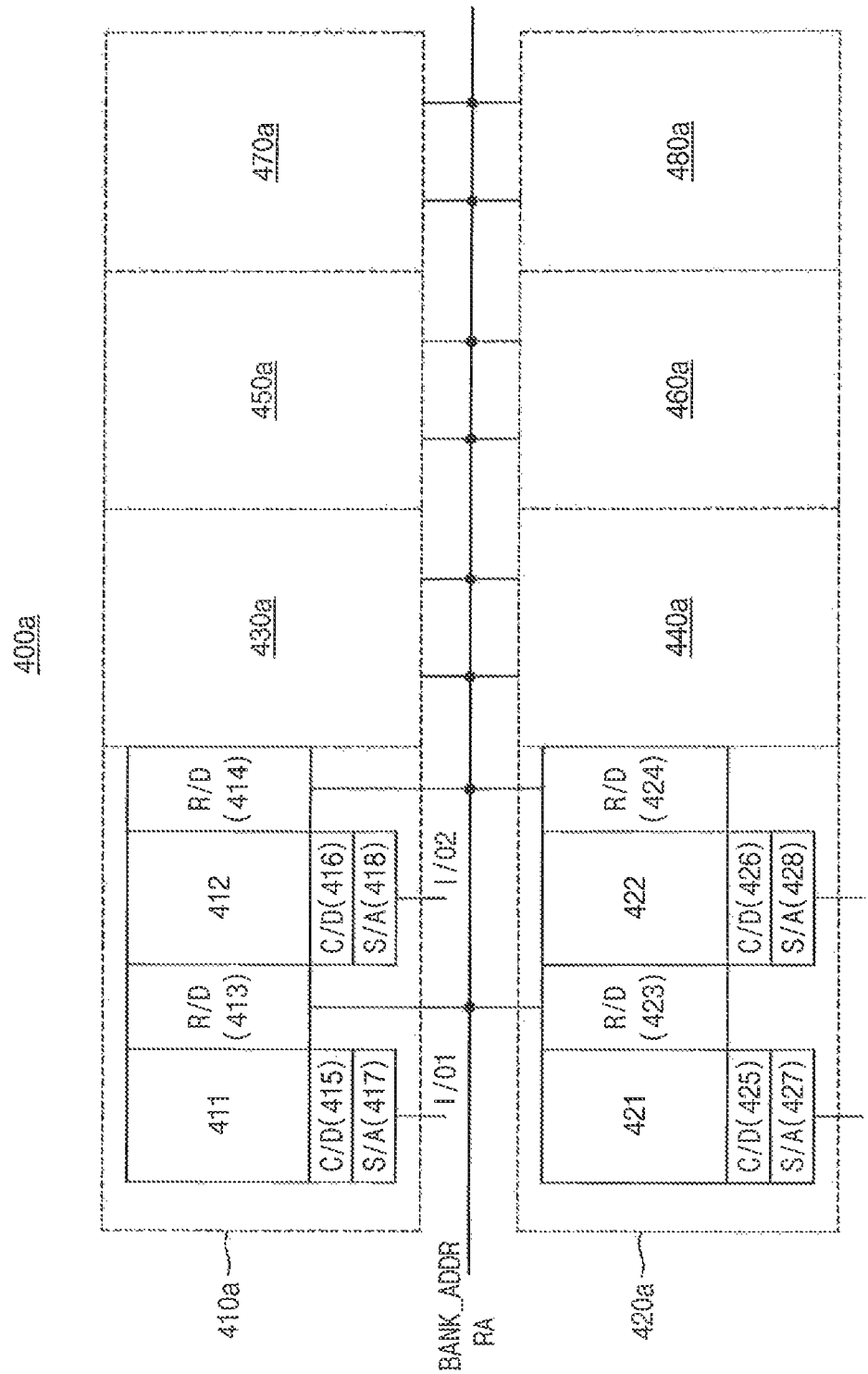
FIG. 13 is a block diagram illustrating the semiconductor memory device of FIG. 3 according to an exemplary embodiment of the present inventive concept.

FIG. 13 is a block diagram illustrating the semiconductor memory device of FIG. 3 according to an exemplary embodiment of the present inventive concept.

Referring to FIG. 13, a semiconductor memory device 400a may include a plurality of banks 410a~480a in which a plurality of memory cells are arranged in columns and rows. Each of the plurality of banks 410a~480a may include a plurality of word-lines, a plurality of bit-lines, and a plurality of memory cells disposed near intersections between the word-lines and the bit-lines. Each of the memory cells may have a DRAM cell configuration.

Although the semiconductor memory device 400a is illustrated in FIG. 13 as including eight banks, the semiconductor memory device 400a may include any number of banks greater or less than eight.

The first bank 410a may include a first sub bank array 411, a second sub bank array 412, a first bank row decoder 413, a second bank row decoder 414, a first bank column decoder 415, a second bank column decoder 416, a first bank sense amplifier block 417 and a second bank sense amplifier block 418. The second bank 420a may include a first sub bank array 421, a second sub bank array 422, a first bank row decoder 423, a second bank row decoder 424, a first bank column decoder 425, a second bank column decoder 426, a first bank sense amplifier block 427 and a second bank sense amplifier block 428. Each configuration of the third through eighth bank 430a~480a may be substantially the same as or similar to each configuration of the first bank 410a and the second bank 420a. The first bank row decoder 413 and the second bank row decoder 414 may receive the bank address BANK_ADDR and the row address RA. The first bank column decoder 415 and the second bank column decoder 416 may receive the column address COL_ADDR. One of the plurality of banks 410a~480a may be selected in response to the bank address BANK_ADDR and memory cells in the selected bank may be accessed in response to the row address RA and the column address COL_ADDR.

The first bank 410a includes the first sub bank array 411 and the second sub bank array 412. The first sub bank array 411 and the second sub bank array 412 are arranged in a row direction in which word-lines of the memory cells are arranged. The first sub bank array 411 may be coupled to the first bank row decoder 413 and the first bank column decoder 415. The second sub bank array 412 may be coupled to the second bank row decoder 414 and the first bank column decoder 416. Memory cells in the first sub bank array 411 may be accessible by the first bank row decoder 413 and the first bank column decoder 415. Memory cells in the second sub bank array 412 may be accessible by the second bank row decoder 414 and the second bank column decoder 416.

One of the first sub bank array 411 and the second sub bank array 412 may be selected based on a bit of the row address RA provided to the first bank row decoder 413 and the second bank row decoder 414. For example, one of the first sub bank array 411 and the second sub bank array 412 may be selected by a most significant bit (MSB) of the row address RA.

The first sub bank array 411 is connected to the first bank sense amplifier block 417 and first data input/output lines I/O1 and the second sub bank array 412 is connected to the second bank sense amplifier block 418 and second data input/output lines I/O2. Data read from the first sub bank array 411 may be output through the first bank sense amplifier block 417 and the first data input/output lines I/O1. Data read from the second sub bank array 412 may be output through the second bank sense amplifier block 418 and the second data input/output lines I/O2.

A first number of memory cells coupled to a bit-line in the first sub bank array 411 may be greater than a second number of memory cells coupled to a bit-line in the second sub bank array 412. A third number of memory cells coupled to a word-line in the first sub bank array 411 may be greater than a fourth number of memory cells coupled to a word-line in the second sub bank array 412. The first sub bank array 411 and the second sub bank array 412 may have different storage capacities with respect to each other.

Figure 14:
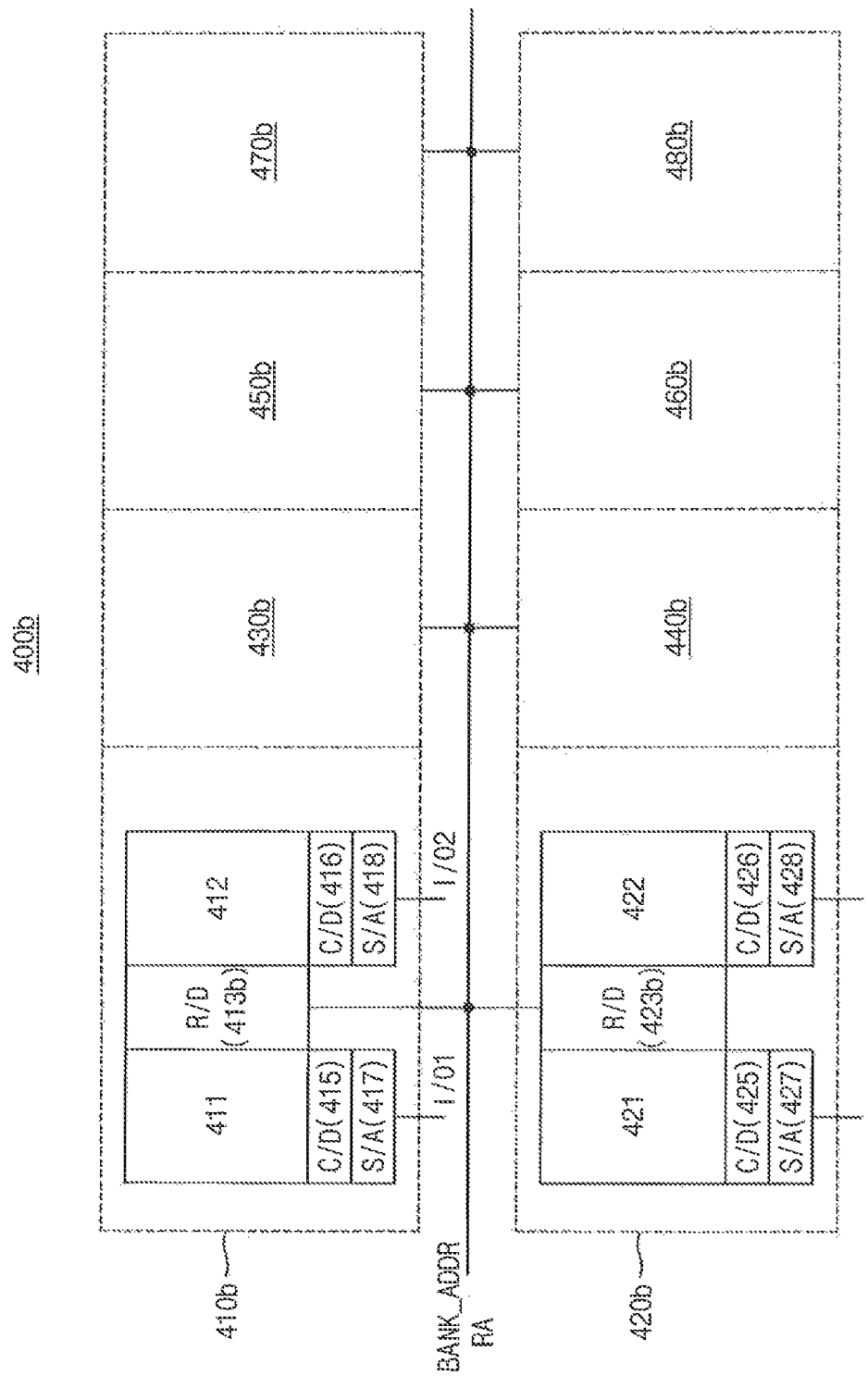
FIG. 14 is a block diagram illustrating the semiconductor memory device of FIG. 3 according to an exemplary embodiment of the present inventive concept.

FIG. 14 is a block diagram illustrating a semiconductor memory device of FIG. 3 according to an exemplary embodiment of the present inventive concept.

Referring to FIG. 14, a semiconductor memory device 400b may include a plurality of banks 410b~480b in which a plurality of memory cells are arranged in columns and rows. Each of the plurality of banks 410b~480b may include a plurality of word-lines, a plurality of bit-lines, and a plurality of memory cells disposed near intersections between the word-lines and the bit-lines. Each of the memory cells may have a DRAM cell configuration.

The first bank 410b may include a first sub bank array 411, a second sub bank array 412, a bank row decoder 413b, a first bank column decoder 415, a second bank column decoder 416, a first bank sense amplifier block 417 and a second bank sense amplifier block 418. The second bank 420b may include a first sub bank array 421, a second sub bank array 422, a bank row decoder 423b, a first bank column decoder 425, a second bank column decoder 426, a first bank sense amplifier block 427 and a second bank sense amplifier block 428. Each configuration of the third through eighth banks 430b~480b may be substantially the same as or similar to each configuration of the first bank 410b and the second bank 420b.

The plurality of banks 410b~480b in FIG. 14 differs from the plurality of banks 410a~480a in FIG. 13 in that one row decoder is shared by the first sub bank array 411/421 and the second sub bank array 412/422.

For example, the first sub bank array 411 and the second sub bank array 412 may be accessible by one row decoder 413b in FIG. 14, and the first sub bank array 421 and the second sub bank array 422 may be accessible by one row decoder 423b in FIG. 14.

Figure 15:
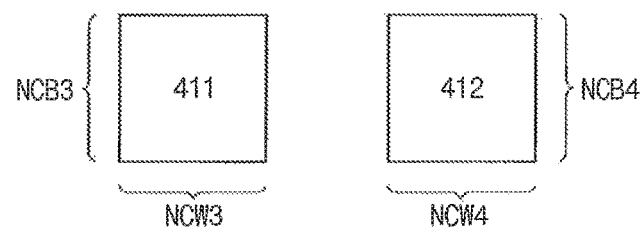
FIG. 15 illustrates the first sub bank array and the second sub bank array in the semiconductor memory device of FIG. 14 according to an exemplary embodiment of the present inventive concept.

FIG. 15 illustrates the first sub bank array and the second sub bank array in the semiconductor memory device of FIG. 14 according to an exemplary embodiment of the present inventive concept.

Referring to FIG. 15, a number NCB3 of memory cells coupled to one bit-line of the first sub bank array 411 may be greater than a number NCB4 of memory cells coupled to one bit-line of the second sub bank array 412. Still referring to FIG. 15, a number NCW3 of memory cells coupled to one word-line of the first sub bank array 411 may be greater than a number NCW4 of memory cells coupled to one word-line of the second sub bank array 412.

Figure 16:
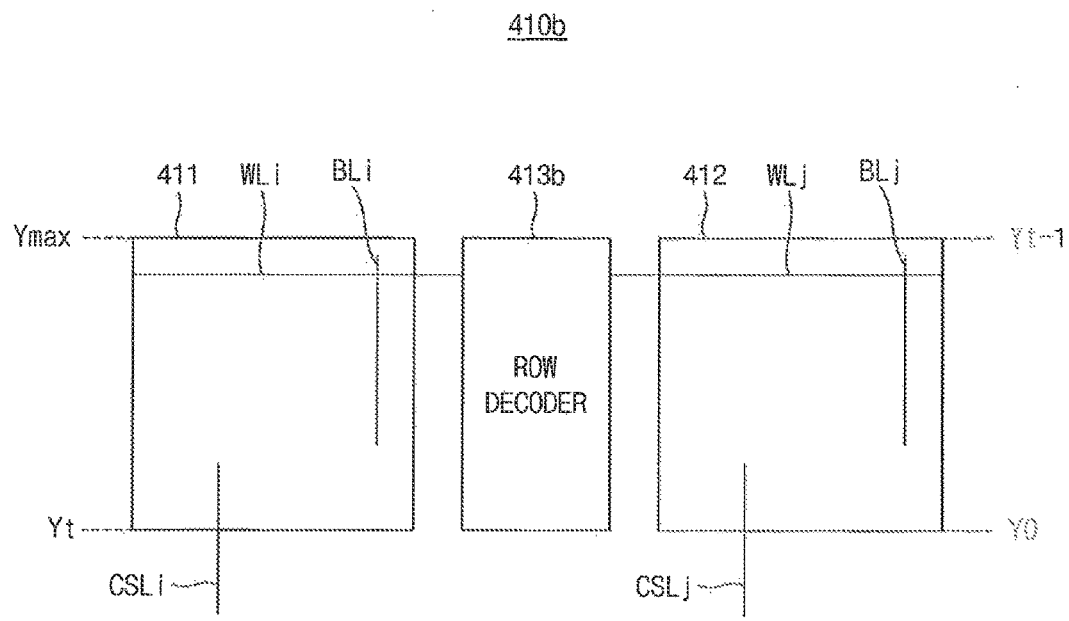
FIG. 16 illustrates an arrangement of bit-lines and word-lines of the semiconductor memory device of FIG. 14 according to an exemplary embodiment of the present inventive concept.

FIG. 16 illustrates an arrangement of bit-lines and word-lines of the semiconductor memory device of FIG. 14 according to an exemplary embodiment of the present inventive concept.

Referring to FIG. 16, the first bank 410 may include the first sub bank array 411 and the second sub bank array 412 which are spaced apart from each other with the row decoder 413b interposed therebetween.

A word-line WLi extended from the row decoder 413b may be disposed only at the first sub bank array 411, and a word-line WLj extended from the row decoder 413b may be disposed only at the second sub bank array 412. If the word-line WLi is selected by the row decoder 413b, memory cells of the first sub bank array 411 connected with the word-line WLi may be accessed. In addition, if the word-line WLj is selected by the row decoder 413b, memory cells of the second sub bank array 412 connected with the word-line WLj may be accessed.

Since the number of memory cells of the first sub bank array 411 coupled to the word-line WLi is greater than the number of memory cells of the second sub bank array 412 coupled to the word-line WLj, word-line loading of the second sub bank array 412 may be relatively small.

Since the number of memory cells of the first sub bank array 411 coupled to a bit-line BLi is greater than the number of memory cells of the second sub bank array 412 coupled to a bit-line BLj, bit-line loading of the second sub bank array 412 may be relatively small. Thus, a read/write operating speed of the second sub bank array 412 may be faster than a read/write operating speed of the first sub bank array 411.

Although the first sub bank array 411 and the second sub bank array 412 are physically separated on a substrate of the semiconductor memory device 400, the first sub bank array 411 and the second sub bank array 412 may provide a continuous address space to an external memory controller. For example, the second sub bank array 412 may provide a lower address space Y0~Yt−1 (t is an integer greater than two), and the first sub bank array 411 may provide an upper address space Yt~Ymax which is successive to the lower address space Y0~Yt−1.

The bit-line BLi of the first sub bank array 411 may be coupled to a column selection line CSLi through a bit-line sense amplifier and the bit-line BLj of the second sub bank array 412 may be coupled to a column selection line CSLj through a bit-line sense amplifier.

When the word-lines WLi and WLj are simultaneously activated and the column selection lines CSLi and CSLj are simultaneously activated, data stored in the second sub bank array 412 may be read faster than data stored in the first sub bank array 411.

Figure 17:
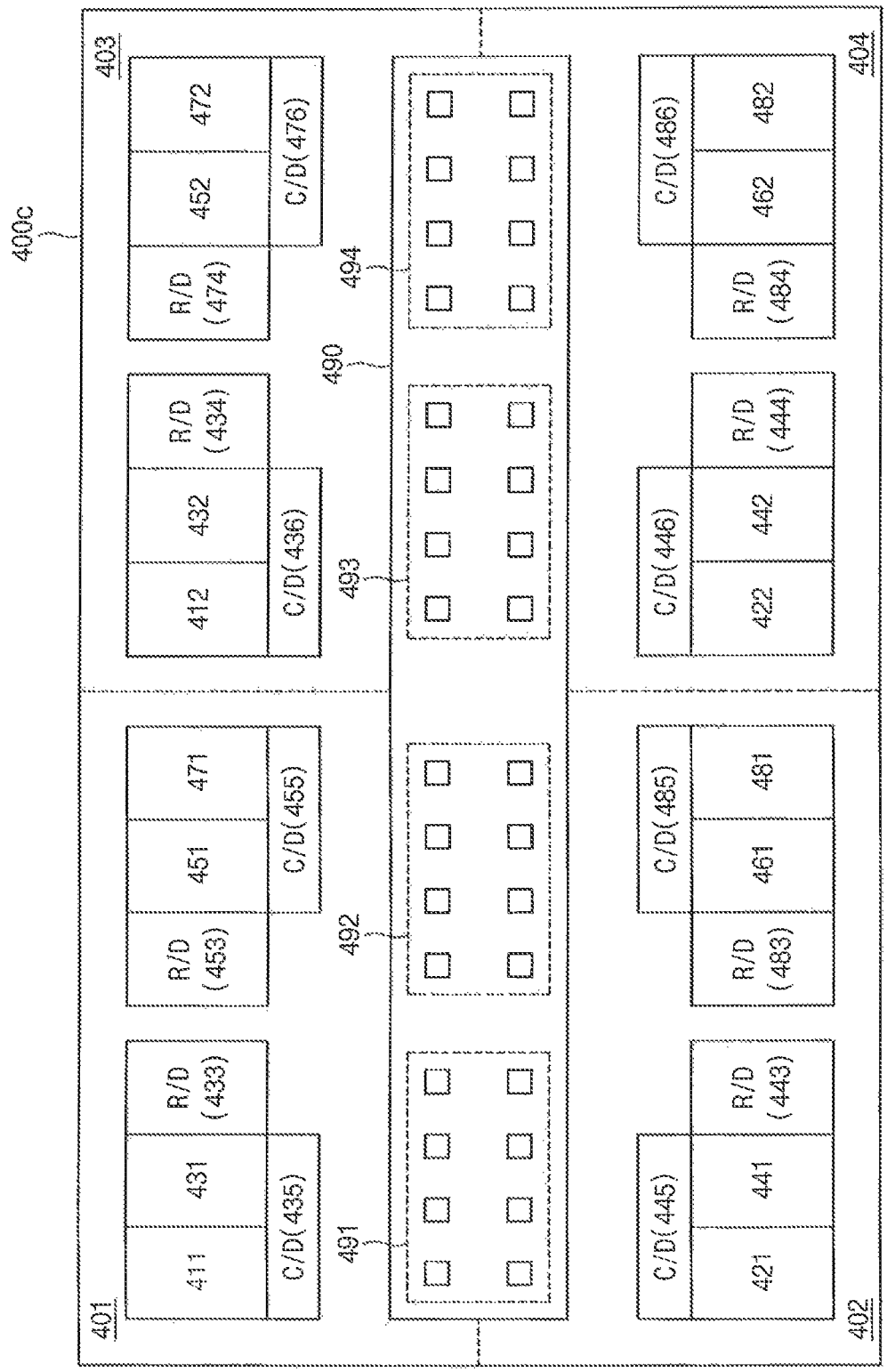
FIG. 17 is a block diagram illustrating a semiconductor memory device according to an exemplary embodiment of the present inventive concept.

FIG. 17 is a block diagram illustrating a semiconductor memory device according to an exemplary embodiment of the present inventive concept.

With an increase of the integration of a memory, the number of memory cells included in a single bank is increased. Thus, in a single bank, a time difference between an input and an output may result due to a distance between a memory cell and an input/output pad. In accordance with an exemplary embodiment of the present inventive concept, there is provided a split bank structure in which a single bank is split into groups and the groups are dispersed. In splitting a single bank into input/output groups, and dispersing and arranging the groups in various regions, the time difference between an input and an output can be reduced and/or prevented.

Referring to FIG. 17, a semiconductor memory device 400c may include an eight bank array, and each of the eight bank arrays is split into two sub array banks. For example, a first bank array may include a first sub bank array 411 arranged in a first region 401 and a second sub bank array 412 arranged in a third region 403, a second bank array may include a first sub bank array 421 arranged in a second region 402 and a second sub bank array 422 arranged in a fourth region 404, a third bank array may include a first sub bank array 431 arranged in the first region 401 and a second sub bank array 432 arranged in the third region 403, and a fourth bank array may include a first sub bank array 441 arranged in the second region 402 and a second sub bank array 442 arranged in the fourth region 404.

In addition, a fifth bank array may include a first sub bank array 451 arranged in the first region 401 and a second sub bank array 452 arranged in the third region 403, a sixth bank array may include a first sub bank array 461 arranged in the second region 402 and a second sub bank array 462 arranged in the fourth region 404, a seventh bank array may include a first sub bank array 471 arranged in the first region 401 and a second sub bank array 472 arranged in the third region 403, and an eighth bank array may include a first sub bank array 481 arranged in the second region 402 and a second sub bank array 482 arranged in the fourth region 404.

The first sub bank arrays 411 and 431 may be accessible by a row decoder 433 and a column decoder 435, and the first sub bank arrays 451 and 471 may be accessible by a row decoder 453 and a column decoder 455. The first sub bank arrays 421 and 441 may be accessible by a row decoder 443 and a column decoder 445, and the first sub bank arrays 461 and 481 may be accessible by a row decoder 483 and a column decoder 485.

The second sub bank arrays 412 and 432 may be accessible by a row decoder 434 and a column decoder 436, and the second sub bank arrays 452 and 472 may be accessible by a row decoder 474 and a column decoder 476. The second sub bank arrays 422 and 442 may be accessible by a row decoder 444 and a column decoder 446, and the second sub bank arrays 462 and 482 may be accessible by a row decoder 484 and a column decoder 486.

A peripheral region 490 is positioned in a long-side direction in a middle portion of the semiconductor memory device 400c. The peripheral region 490 includes a plurality of pads 491, 492, 493 and 494 for inputting and outputting signals for performing a memory operation on the banks.

As an example, the first sub bank array 411 of the first bank array may use the pads 491 for inputting and outputting data and the second sub bank array 412 of the first bank array may use the pads 493 for inputting and outputting data.

In addition, a number of memory cells coupled to a bit-line of the first sub bank array 411 may be greater than a number of memory cells coupled to a bit-line of the second sub bank array 412, and a number of memory cells coupled to a word-line of the first sub bank array 411 may be greater than a number of memory cells coupled to a word-line of the second sub bank array 412.

When the first sub bank array and the second sub bank array in one bank are dispersed and arranged as shown in FIG. 17 and the first sub bank array and the second sub bank array have different data storage capacities, the semiconductor memory device 400c may reduce current consumption by providing various data input/output bandwidth.

Figure 18:
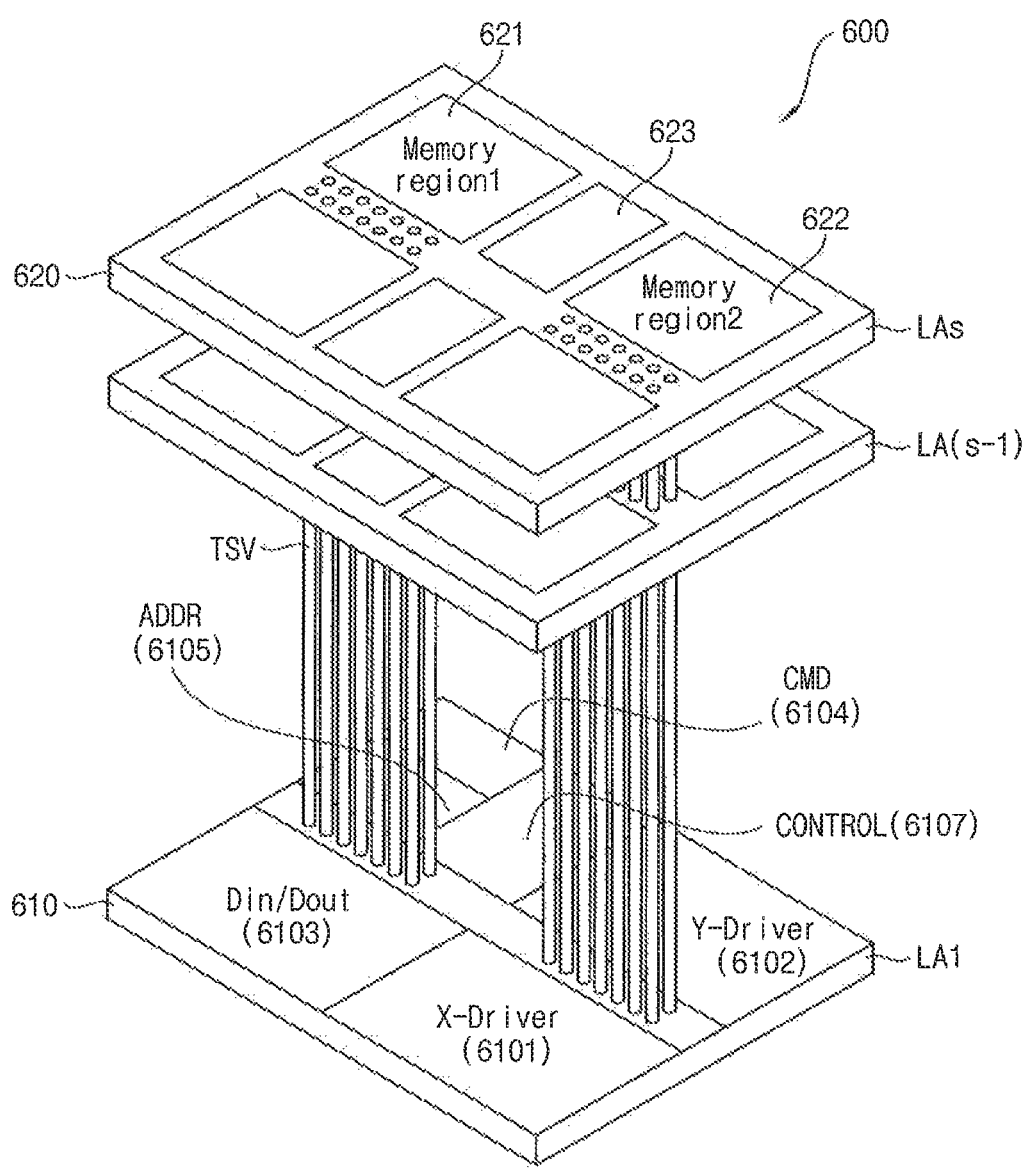
FIG. 18 is a structural diagram illustrating a semiconductor memory device according to an exemplary embodiment of the present inventive concept.

FIG. 18 is a structural diagram illustrating a semiconductor memory device according to an exemplary embodiment of the present inventive concept.

Referring to FIG. 18, a semiconductor memory device 600 may include first through nth semiconductor integrated circuit layers LA1 through LAs, in which the lowest first semiconductor integrated circuit layer LA1 is an interface or a control chip and the other semiconductor integrated circuit layers LA2 through LAs are slave chips including core memory chips. The first through nth semiconductor integrated circuit layers LA1 through LAs may transmit and receive signals therebetween through through-silicon-vias (TSVs). The lowest first semiconductor integrated circuit layer LA1 as the interface or control chip may communicate with an external memory controller through a conductive structure formed on an external surface. A description will be made regarding the structure and an operation of the semiconductor memory device 600 by mainly using the first semiconductor integrated circuit layer LA1 or 610 as the interface or control chip and the sth semiconductor integrated circuit layer LAs or 620 as the slave chip.

The first semiconductor integrated circuit layer 610 may include various peripheral circuits for driving a first memory region 621 and a second memory region 622 provided in the sth semiconductor integrated circuit layer 620. For example, the first semiconductor integrated circuit layer 610 may include a row (X)-driver 6101 for driving word-lines of a memory, a column (Y)-driver 6102 for driving bit lines of the memory, a data input/output unit (Din/Dout) 6103 for controlling input/output of data, a command buffer (CMD) 6104 for receiving a command CMD from the outside and buffering the command CMD, and an address buffer (ADDR) 6105 for receiving an address from the outside and buffering the address. The first memory region 621 and the second memory region 622 may include a plurality of bank arrays in which memory cells are arranged as described with reference to FIGS. 5 and 6.

The first semiconductor integrated circuit layer 610 may further include a control logic 6107. The control logic 6107 may control an access to the first memory region 621 and the second memory region 622 based on a command and an address signal from a memory controller.

The sth semiconductor integrated circuit layer 620 may include the first memory region 621, the second memory region 622 and peripheral circuit regions 623 in which peripheral circuits for reading/writing data of the first memory region 621 and the second memory region 622 are arranged. The peripheral circuits may include, e.g., a row decoder, a column decoder, a bit line sense amplifier, etc.

A number of memory cells coupled to a bit-line of the first memory region 621 may be greater than a number of memory cells coupled to a bit-line of the second memory region 622, and a number of memory cells coupled to a word-line of the first memory region 621 may be greater than a number of memory cells coupled to a word-line of the second memory region 622 as described with reference to FIGS. 3 through 17.

Figure 19:
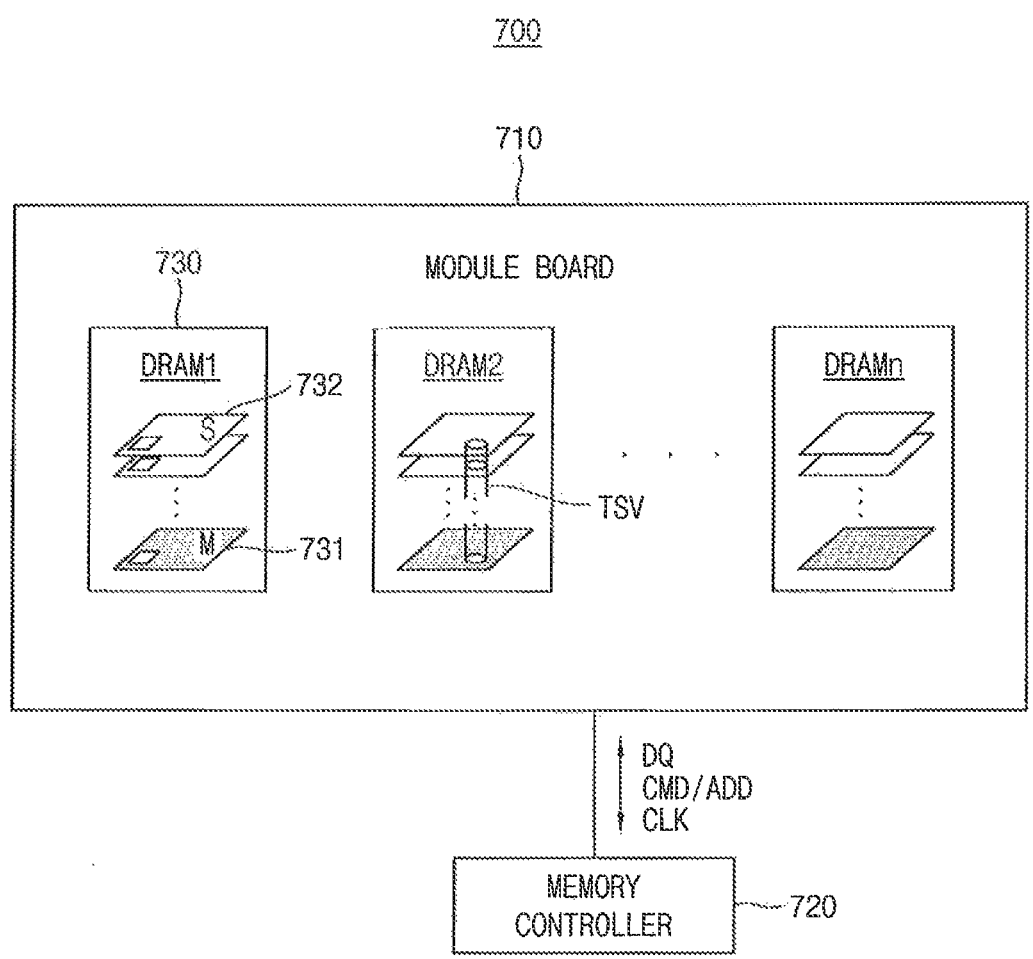
FIG. 19 illustrates a memory system including a semiconductor memory device according to an exemplary embodiment of the present inventive concept.

FIG. 19 illustrates a memory system including the semiconductor memory device according to an exemplary embodiment of the present inventive concept.

Referring to FIG. 19, a memory system 700 may include a memory module 710 and a memory controller 720. The memory module 710 may include at least one semiconductor memory device 730 mounted on a module board. The semiconductor memory device 730 may employ the semiconductor memory device 200a of FIG. 3 or one of the semiconductor memory devices 400a, 400b and 400c of FIGS. 13, 14 and 17. For example, the semiconductor memory device 730 may be a DRAM chip. In addition, the semiconductor memory device 730 may include a stack of semiconductor chips. In this case, the semiconductor chips may include at least one master chip 731 and at least one slave chip 732. Signal transfer between the semiconductor chips may occur via through-silicon vias TSV.

Therefore, the semiconductor memory device 730 may include a memory cell array having a plurality of bank arrays. A number of memory cells coupled to a bit-line of a first bank array of the plurality of bank arrays may be greater than a number of memory cells coupled to a bit-line of a second bank array of the plurality of bank arrays, and a number of memory cells coupled to a word-line of the first bank array may be greater than a number of memory cells coupled to a word-line of the second bank array.

In addition, in an exemplary embodiment of the present inventive concept, a three dimensional (3D) memory array is provided in semiconductor memory device 730. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" may mean that layers of each level of the array are directly deposited on the layers of each underlying level of the array. The following patent documents, which are hereby incorporated by reference in their entireties, describe configurations of 3D memory arrays, in which the 3D memory array is configured as a plurality of levels, with word-lines and/or bit-lines shared between levels: U.S. Pat. Nos. 7,679,133; 8,553,466; 8,654,587; 8,559,235; and U.S. Pat. Pub. No. 2011/0233648.

The memory module 710 may communicate with the memory controller 720 via a system bus. Data DQ, a command/address CMD/ADD, and a clock signal CLK may be transmitted and received between the memory module 710 and the memory controller 720 via the system bus.

Figure 20:
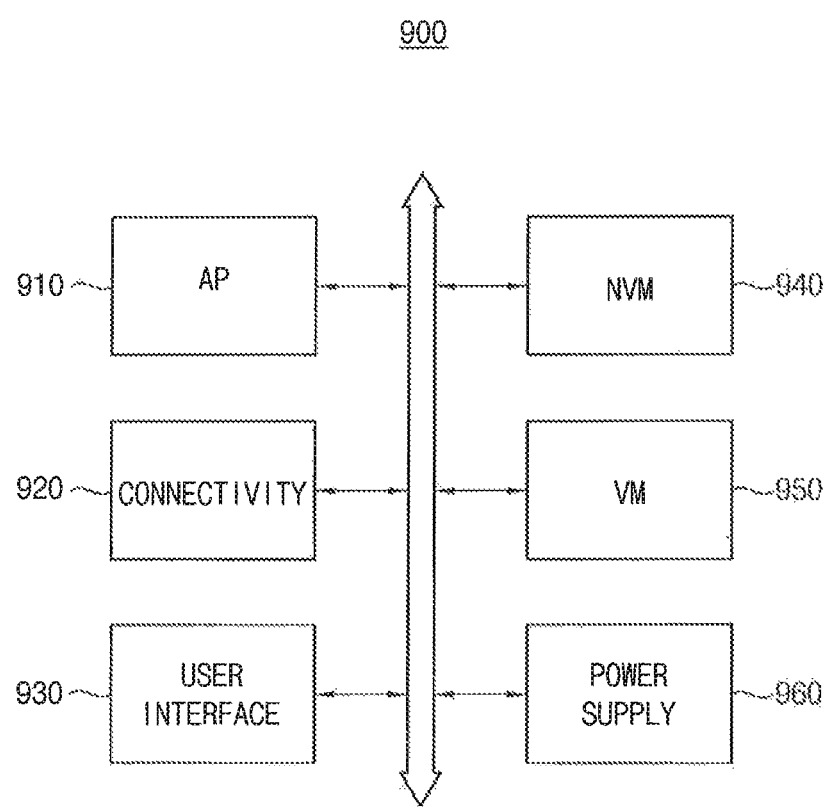
FIG. 20 is a block diagram illustrating a mobile system including a semiconductor memory device according to an exemplary embodiment of the present inventive concept.

FIG. 20 is a block diagram illustrating a mobile system including the semiconductor memory device according to an exemplary embodiment of the present inventive concept.

Referring to FIG. 20, a mobile system 900 may include an application processor 910, a connectivity unit 920, a semiconductor memory device 950, a nonvolatile memory device 940, a user interface 930 and a power supply 960. In an exemplary embodiment of the present inventive concept, the mobile system 900 may be a mobile phone, a smart phone, a personal digital assistant (PDA), a portable multimedia player (PMP), a digital camera, a music player, a portable game console, a navigation system, etc.

The application processor 910 may execute applications, such as a web browser, a game application, a video player, etc. In an exemplary embodiment of the present inventive concept, the application processor 910 may include a single core or multiple cores. For example, the application processor 910 may be a multi-core processor, such as a dual-core processor, a quad-core processor, a hexa-core processor, etc. The application processor 910 may include an internal or external cache memory.

The connectivity unit 920 may perform wired or wireless communication with an external device. For example, the connectivity unit 920 may perform Ethernet communication, near field communication (NFC), radio frequency identification (RFID) communication, mobile telecommunication, memory card communication, USB communication, etc. In an exemplary embodiment of the present inventive concept, the connectivity unit 920 may include a baseband chipset that supports communications, such as global system for mobile communications (GSM), general packet radio service (GPRS), wideband code division multiple access (WCDMA), high speed downlink/uplink packet access (HSxPA), etc.

The semiconductor memory device 950 may store data processed by the application processor 910 or operate as a working memory. The semiconductor memory device 950 may be a DRAM, such as a DDR SDRAM, an LPDDR SDRAM, a GDDR SDRAM, an RDRAM, etc. The semiconductor memory device 950 may employ the semiconductor memory device 200a of FIG. 3 or one of the semiconductor memory devices 400a, 400b and 400c of FIGS. 13, 14 and 17. Therefore, the semiconductor memory device 950 may include a memory cell array having a plurality of bank arrays. A number of memory cells coupled to a bit-line of a first bank array of the plurality of bank arrays may be greater than a number of memory cells coupled to a bit-line of a second bank array of the plurality of bank arrays, and a number of memory cells coupled to a word-line of the first bank array may be greater than a number of memory cells coupled to a word-line of the second bank array.

The nonvolatile memory device 940 may store a boot image for booting the mobile system 900. For example, the nonvolatile memory device 940 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 930 may include at least one input device, such as a keypad, a touch screen, etc., and at least one output device, such as a speaker, a display device, etc. The power supply 960 may supply a power supply voltage to the mobile system 900. In an exemplary embodiment of the present inventive concept, the mobile system 900 may further include a camera image processor (CIS), and/or a storage device, such as a memory card, a solid state drive (SSD), a hard disk drive (HDD), a compact disk-read only memory (CD-ROM), etc.

In an exemplary embodiment of the present inventive concept, the mobile system 900 and/or components of the mobile system 900 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), or wafer-level processed stack package (WSP).

Figure 21:
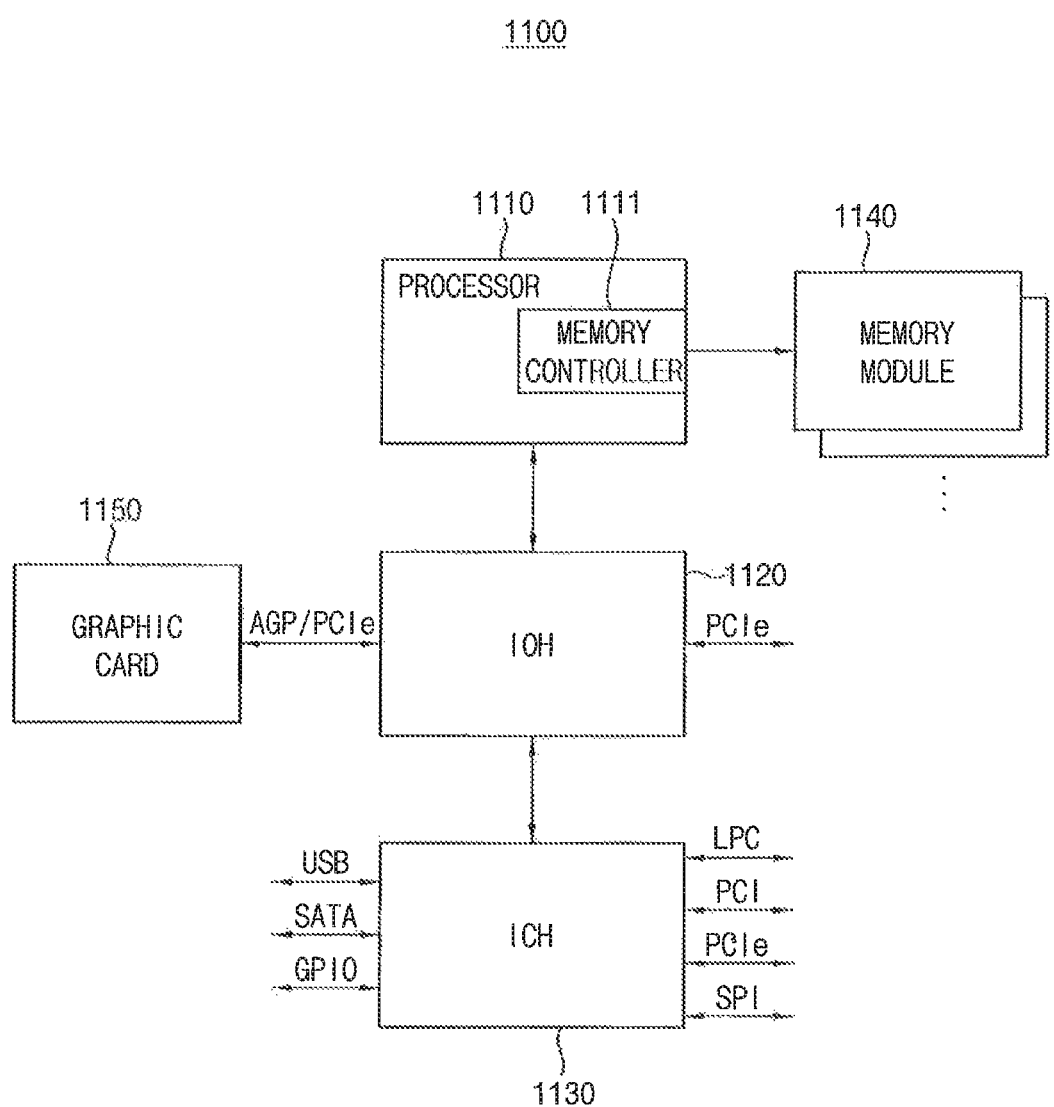
FIG. 21 is a block diagram illustrating a computing system including a semiconductor memory device according to an exemplary embodiment of the present inventive concept.

FIG. 21 is a block diagram illustrating a computing system including the semiconductor memory device according to an exemplary embodiment of the present inventive concept.

Referring to FIG. 21, a computing system 1100 may include a processor 1110, an input/output hub (IOH) 1120, an input/output controller hub (ICH) 1130, at least one memory module 1140 and a graphics card 1150. In an exemplary embodiment of the present inventive concept, the computing system 1100 may be a personal computer (PC), a server computer, a workstation, a laptop computer, a mobile phone, a smart phone, a PDA, a PMP, a digital camera, a digital television, a set-top box, a music player, a portable game console, a navigation system, etc.

The processor 1110 may perform various computing functions, such as executing specific software for performing specific calculations or tasks. For example, the processor 1110 may be a microprocessor, a central processing unit (CPU), a digital signal processor, or the like. In an exemplary embodiment of the present inventive concept, the processor 1110 may include a single core or multiple cores. For example, the processor 1110 may be a multi-core processor, such as a dual-core processor, a quad-core processor, a hexa-core processor, etc. Although FIG. 21 illustrates the computing system 1100 including one processor 1110, in an exemplary embodiment of the present inventive concept, the computing system 1100 may include a plurality of processors. The processor 1110 may include an internal or external cache memory.

The processor 1110 may include a memory controller 1111 for controlling operations of the memory module 1140. The memory controller 1111 included in the processor 1110 may be referred to as an integrated memory controller (IMC). A memory interface between the memory controller 1111 and the memory module 1140 may be implemented with a single channel including a plurality of signal lines, or may be implemented with multiple channels. For example, each channel may be coupled with at least one memory module 1140. In an exemplary embodiment of the present inventive concept, the memory controller 1111 may be located inside the input/output hub 1120, which may be referred to as a memory controller hub (MCH).

The memory module 1140 may include a plurality of semiconductor memory devices that store data provided from the memory controller 1111. Each of the plurality of semiconductor memory devices may employ the semiconductor memory device 200a of FIG. 3 or one of the semiconductor memory devices 400a, 400b and 400c of FIGS. 13, 14 and 17. Therefore, each of the plurality of semiconductor memory devices may include a memory cell array having a plurality of bank arrays. A number of memory cells coupled to a bit-line of a first bank array of the plurality of bank arrays may be greater than a number of memory cells coupled to a bit-line of a second bank array of the plurality of bank arrays, and a number of memory cells coupled to a word-line of the first bank array may be greater than a number of memory cells coupled to a word-line of the second bank array.

The input/output hub 1120 may manage data transfer between the processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a HyperTransport, a lightning data transport (LDT), a Quick-Path interconnect (QPI), a common system interface (CSI), etc. Although FIG. 21 illustrates the computing system 1100 including one input/output hub 1120, in an exemplary embodiment of the present inventive concept, the computing system 1100 may include a plurality of input/output hubs. The input/output hub 1120 may provide various interfaces with devices. For example, the input/output hub 1120 may provide an accelerated graphics port (AGP) interface, a PCIe, a communications streaming architecture (CSA) interface, etc.

The graphics card 1150 may be coupled to the input/output hub 1120 via AGP or PCIe. The graphics card 1150 may control a display device for displaying an image. The graphics card 1150 may include an internal processor for processing image data and an internal semiconductor memory device. In an exemplary embodiment of the present inventive concept, the input/output hub 1120 may include an internal graphics device along with or instead of the graphics card 1150 outside the input/output hub 1120. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a USB port, a SATA port, a general purpose input/output (GPIO), a low pin count (LPC) bus, an SPI, PCI, PCIe, etc.

In an exemplary embodiment of the present inventive concept, the processor 1110, the input/output hub 1120 and the input/output controller hub 1130 may be implemented as separate chipsets or as separate integrated circuits. In an exemplary embodiment of the present inventive concept, at least two of the processor 1110, the input/output hub 1120 and the input/output controller hub 1130 may be implemented as a single chipset.

Exemplary embodiments of the present inventive concept may be applied to systems using semiconductor memory devices. Exemplary embodiments of the present inventive concept may be applied to systems such as a mobile phone, a smart phone, a PDA, a PMP, a digital camera, a camcorder, a PC, a server computer, a workstation, a laptop computer, a digital television (TV), a set-top box, a portable game console, a navigation system, etc.

An exemplary embodiment of the present inventive concept provides a semiconductor memory device capable of reducing current consumption without increasing area.

For example, in an exemplary embodiment of the present inventive concept, the first sub bank array and the second sub bank array may be arranged physically separate from each other in a substrate in which the plurality of bank arrays are formed. The first sub bank array and the second sub bank array may provide a continuous address space to the memory controller.

Further, in a semiconductor memory device according to an exemplary embodiment of the present inventive concept, a current consumption may be reduced by differentiating a first number of memory cells coupled to a bit-line of a first bank array and a second number of memory cells coupled to a bit-line of a second bank array.

While the present inventive concept has been particularly shown and described with reference to exemplary embodiments thereof, it will be apparent to those of ordinary skill in the art that various changes in form and detail may be made therein without departing from the spirit and scope of the present inventive concept as defined by the following claims.

What is claimed is:

1. A semiconductor memory device, comprising:
   a memory cell array including a plurality of bank arrays, each of the plurality of bank arrays including a plurality of memory cells, each of the plurality of memory cells including a transistor and a capacitor;
   a control logic circuit configured to control access to the memory cell array in response to a command and an address, the control logic circuit including a mode register configured to set an operation mode of the semiconductor memory device in response to the command; and
   a bank control logic configured to activate a corresponding row decoder and a corresponding column decoder which are associated with each of the plurality of bank arrays in response to a bank address of the address,
   wherein a first number of memory cells are coupled to a bit-line of a first bank array of the plurality of bank arrays, a second number of memory cells are coupled to a bit-line of a second bank array of the plurality of bank arrays and the first number is different from the second number,
   wherein the plurality of bank arrays are grouped into a first bank group, a second bank group, a third bank group and a fourth bank group,
   wherein the first bank group includes the first bank array and a third bank array, the second bank group includes the second bank array and a fourth bank array, the third bank group includes a fifth bank array and a seventh bank array, and the fourth bank group includes a sixth bank array and an eighth bank array,
   wherein the first number of memory cells are coupled to a bit-line of the third bank array, and the second number of memory cells are coupled to a bit-line of the fourth bank array,
   wherein a third number of memory cells, different from the first number of memory cells and the second number of memory cells, are coupled to a bit-line of the fifth bank array and a bit-line of the sixth bank array.

2. The semiconductor memory device of claim 1, wherein the first number is two times greater than the second number.

3. The semiconductor memory device of claim 1, wherein the first bank array includes a first set of memory cells which is arranged in rows and columns,
   wherein the second bank array includes a second set of memory cells which is arranged in rows and columns, and
   wherein each of the first set of memory cells and each of the second set of the memory cells are same types of dynamic random access memory (DRAM) cells.

4. The semiconductor memory device of claim 3, wherein each of the first set of memory cells has a first bit-line loading time, each of the second set of memory cells has a second bit-line loading time, and the second bit-line loading time is less than the first bit-line loading time.

5. The semiconductor memory device of claim 1, wherein a fifth number of memory cells are coupled to a word-line of the first bank array of the plurality of bank arrays, a sixth number of memory cells are coupled to a word-line of the second bank array of the plurality of bank arrays and the fifth number is different from the sixth number.

6. The semiconductor memory device of claim 5, wherein the fifth number is greater than the sixth number.

7. The semiconductor memory device of claim 1, wherein the plurality of bank arrays are grouped into the first, second, third and fourth bank groups in response to the bank address of the address.

8. The semiconductor memory device of claim 7, wherein:
   a fifth number of memory cells are coupled to a word-line of the third bank array,
   a sixth number of memory cells are coupled to a word-line of the fourth bank array, and
   the sixth number is smaller than the fifth number.

9. The semiconductor memory device of claim 1, wherein a fourth number of memory cells, different from the first through third numbers of memory cells, are coupled to a bit-line of the seventh bank array and a bit-line of the eighth bank array.

10. A semiconductor memory device, comprising:
    a memory cell array including a plurality of bank arrays, each of the plurality of bank arrays including a plurality of memory cells, each of the plurality of memory cells including a transistor and a capacitor;
    a control logic circuit configured to control access to the memory cell array in response to a command and an address, the control logic circuit including a mode register configured to set an operation mode of the semiconductor memory device in response to the command; and a bank control logic configured to activate a corresponding row decoder and a corresponding column decoder which are associated with each of the plurality of bank arrays in response to a bank address of the address, wherein each of the plurality of bank arrays, which are sequentially arranged in a row, includes a first sub bank array and a second sub bank array which are distinguished from each other by at least a portion of the address, the first and second sub bank arrays being adjacent to each other without any sub bank arrays disposed therebetween, and wherein a first number of memory cells are coupled to a bit-line of the first sub bank array, a second number of memory cells are coupled to a bit-line of the second sub bank array and the first number is different from the second number, and wherein a row decoder receives a row address of the address and is disposed between the first sub bank array and the second sub bank array, a first wordline is extended from the row decoder to the first sub bank array and a second wordline is extended from the row decoder to the second sub bank array.

11. The semiconductor memory device of claim 10, wherein the first sub bank array and the second sub bank array are accessible by the row decoder disposed therebetween.

12. The semiconductor memory device of claim 11, wherein the first sub bank array includes a first set of dynamic random access memory (DRAM) cells which are arranged in rows and columns, wherein the second sub bank array includes a second set of DRAM cells which are arranged in rows and columns, and wherein each of the first set of DRAM cells has a first bit-line loading time, each of the second set of DRAM cells has a second bit-line loading time, and the second bit-line loading time is less than the first bit-line loading time.

13. The semiconductor memory device of claim 10, wherein the first sub bank array and the second sub bank array are physically separate from each other in a substrate in which the plurality of bank arrays are formed.

14. The semiconductor memory device of claim 13, wherein the first sub bank array and the second sub bank array form a continuous address space for an external memory controller.

15. A semiconductor memory device, comprising:

a memory array including a plurality of bank arrays, each of the plurality of bank arrays including a plurality of memory cells, each of the plurality of memory cells including a transistor and a capacitor; and a control logic circuit configured to perform a read operation and a write operation with respect to the memory array in response to a command and an address, the control logic circuit including a mode register configured to set an operation mode of the semiconductor memory device in response to the command; and a bank control logic configured to activate a corresponding row decoder and a corresponding column decoder which are associated with each of the plurality of bank arrays in response to a bank address of the address, wherein a bank array of each of the plurality of bank arrays, which are sequentially arranged in a row, includes a first sub bank array and a second sub bank array that are adjacent to each other in a substrate in which the plurality of bank arrays are formed, wherein no sub bank arrays are disposed between the first and second sub bank arrays, wherein the second sub bank array provides a lower address space and the first sub bank array provides an upper address space for a memory controller, wherein a row decoder receives a row address of the address and is disposed between the first sub bank array and the second sub bank array, and wherein a first number of memory cells coupled to a bit line of the first sub bank array is distinguished from a second number of memory cells coupled to a bit line of the second sub bank array.

* * * * *